(12) United States Patent  
Iguchi et al.

(10) Patent No.: US 12,388,232 B2  
(45) Date of Patent: Aug. 12, 2025

(54) LIGHT-EMITTING DEVICE, OPTICAL DEVICE, MEASUREMENT DEVICE, AND INFORMATION PROCESSING APPARATUS

(71) Applicant: FUJIFILM BUSINESS INNOVATION CORP., Tokyo (JP)

(72) Inventors: Daisuke Iguchi, Kanagawa (JP); Kazuhiro Sakai, Kanagawa (JP); Takeshi Minamiru, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 1111 days.

(21) Appl. No.: 17/109,728

(22) Filed: Dec. 2, 2020

(65) Prior Publication Data

US 2021/0305774 A1    Sep. 30, 2021

(30) Foreign Application Priority Data

Mar. 24, 2020  (JP) .................................. 2020-052022

(51) Int. Cl.
*H01S 5/042* (2006.01)
*G01S 7/481* (2006.01)
*G06V 40/16* (2022.01)
*H01S 5/00* (2006.01)

(52) U.S. Cl.
CPC ........ *H01S 5/04256* (2019.08); *G01S 7/4815* (2013.01); *G06V 40/161* (2022.01); *H01S 5/005* (2013.01)

(58) Field of Classification Search
CPC ..................................................... G01S 7/484
See application file for complete search history.

(56) References Cited

U.S. PATENT DOCUMENTS

| 9,368,936 | B1 | 6/2016 | Lenius et al. |
| 11,316,322 | B2* | 4/2022 | Galvano ............... G01S 7/4813 |
| 11,923,658 | B1* | 3/2024 | Lenius .................... G01S 7/484 |
| 2002/0051128 | A1* | 5/2002 | Aoyama ............... G01S 7/4811 |
| | | | 356/4.03 |

(Continued)

FOREIGN PATENT DOCUMENTS

| JP | 2002231869 A | * | 8/2002 |
| JP | 2008-252129 A | | 10/2008 |

(Continued)

OTHER PUBLICATIONS

Nicolas Bonod and Jérôme Neauport, "Diffraction gratings: from principles to applications in high-intensity lasers," Adv. Opt. Photon. 8, 156-199 (2016) (Year: 2016).*

(Continued)

*Primary Examiner* — Luke D Ratcliffe  
*Assistant Examiner* — Clara G Chilton  
(74) *Attorney, Agent, or Firm* — Oliff PLC

(57) ABSTRACT

A light-emitting device includes a laser element array having a quadrangular planar shape, a pair of capacitors that supply an electric current for light emission of the laser element array, and a driving unit that drives the laser element array by turning on and off the electric current for light emission of the laser element array. The pair of capacitors are disposed beside two sides of the laser element array that face each other so as to sandwich the laser element array, and the driving unit is disposed beside another side of the laser element array.

18 Claims, 16 Drawing Sheets

(56) References Cited

U.S. PATENT DOCUMENTS

| | | | |
|---|---|---|---|
| 2018/0102442 A1* | 4/2018 | Wang | H01L 31/02327 |
| 2019/0213309 A1* | 7/2019 | Morestin | G01S 17/04 |
| 2019/0266953 A1* | 8/2019 | Lee | G09G 3/3233 |
| 2021/0176389 A1* | 6/2021 | Watanabe | H01S 5/0683 |

FOREIGN PATENT DOCUMENTS

| | | | |
|---|---|---|---|
| JP | 2010177591 A | * | 8/2010 |
| JP | 2015153862 A | * | 8/2015 |

OTHER PUBLICATIONS

Techweb "Effective Use of Decoupling (Bypass) Capacitors Point 1" Oct. 25, 2018, https://techweb.rohm.com/know-how/nowisee/7669/ (Year: 2018).*

Infineon, "Benefits of low side MOSFET drivers in SMPS", Nov. 11, 2016 (Year: 2016).*

Canada Metal, "Different Types of Lead Plating Anodes and Their Applications", Jul. 31, 2017, https://www.canadametal.com/different-types-lead-plating-anodes-applications/#:~:text=(Lead%2Dalloy%20anodes%20are%20used,the%20corrosive%20effects%20of%20seawater. (Year: 2017).*

Feb. 6, 2024 Office Action Issued in Japanese Patent Application No. 2020-052022.

Dec. 28, 2024 Office Action issued in Chinese Patent Application No. 202011237785.6.

* cited by examiner

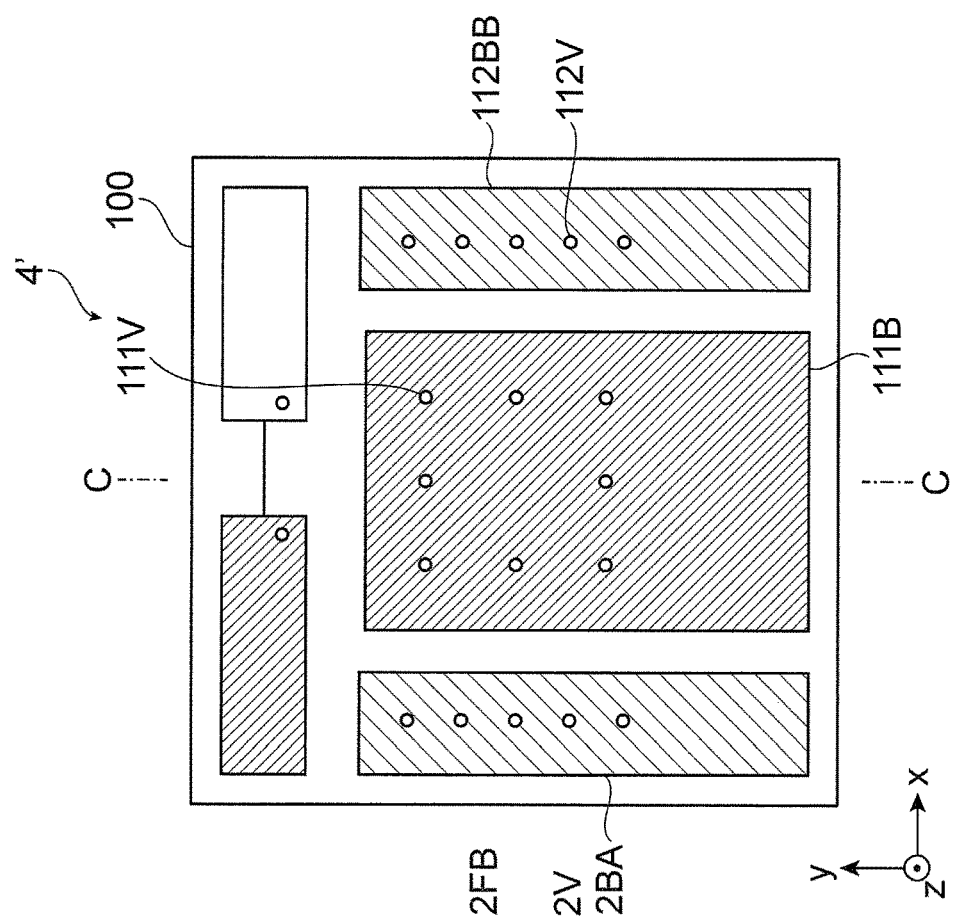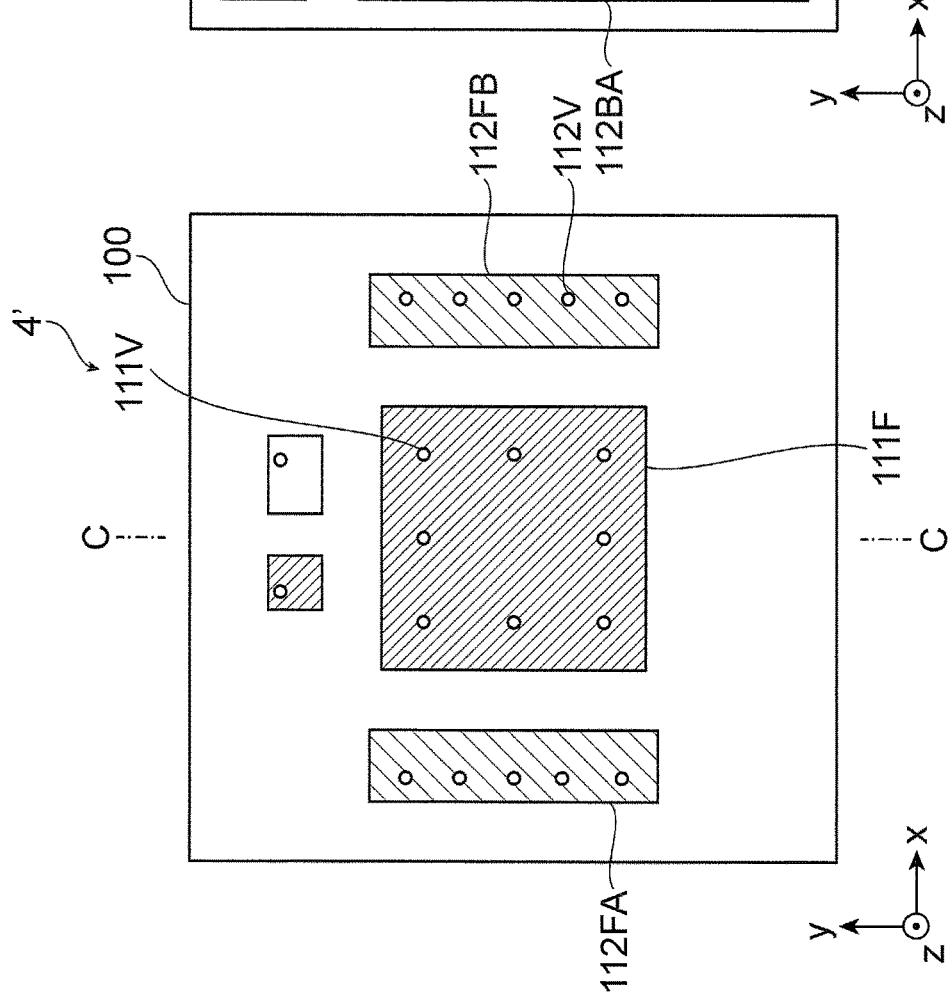

LIGHT-EMITTING DEVICE, OPTICAL DEVICE, MEASUREMENT DEVICE, AND INFORMATION PROCESSING APPARATUS

CROSS-REFERENCE TO RELATED APPLICATIONS

This application is based on and claims priority under 35 USC 119 from Japanese Patent Application No. 2020-052022 filed Mar. 24, 2020.

BACKGROUND

(i) Technical Field

The present disclosure relates to a light-emitting device, an optical device, a measurement device, and an information processing apparatus.

(ii) Related Art

Japanese Unexamined Patent Application Publication No. 2008-252129 describes a light-emitting device including a ceramic substrate having light transmission properties, a light-emitting element mounted on a surface of the ceramic substrate, a wiring pattern for supplying power to the light-emitting element, and a metallization layer made of a metal having light reflectivity, the metallization layer being provided in the ceramic substrate so as to reflect light emitted from the light-emitting element.

SUMMARY

Measurement of a three-dimensional shape of an object to be measured according to a Time of Flight (ToF) method using a flight time of light requires a short rise time of light emission of a light source. For this purpose, it is effective to reduce effective inductance of a path through which an electric current for light emission flows.

Aspects of non-limiting embodiments of the present disclosure relate to a light-emitting device etc. in which effective inductance of a path through which an electric current for light emission flows is reduced as compared with a case where a pair of capacitors are not disposed beside two sides of a light source so as to sandwich the light source and a driving unit is not disposed beside another side of the light source.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light-emitting device including a laser element array having a quadrangular planar shape, a pair of capacitors that supply an electric current for light emission of the laser element array, and a driving unit that drives the laser element array by turning on and off the electric current for light emission of the laser element array, wherein the pair of capacitors are disposed beside two sides of the laser element array that face each other so as to sandwich the laser element array, and the driving unit is disposed beside another side of the laser element array.

BRIEF DESCRIPTION OF THE DRAWINGS

An exemplary embodiment of the present disclosure will be described in detail based on the following figures, wherein:

FIG. 5A is a plan view, and FIG. 5B is a cross-sectional view taken along line VB-VB;

FIG. 7A is a plan view, and FIG. 7B is a cross-sectional view taken along line VIIB-VIIB of FIG. 7A;

FIG. 9A is a plan view, and FIG. 9B is a cross-sectional view taken along line IXB-IXB of FIG. 9A;

FIGS. 10A and 10B are views for explaining wires provided on a front surface side of a heat releasing base member and wires provided on a rear surface side of the heat releasing base member in the light-emitting device according to the modification, FIG. 10A illustrates the wires on the front surface side, and FIG. 10B illustrates the wires on the rear surface side;

FIG. 11A is a plan view, and FIG. 11B is a cross-sectional view taken along line XIB-XIB of FIG. 11A;

FIG. 12A illustrates the wires on the front surface side, and FIG. 12B illustrates the wires on the rear surface side;

FIG. 14A is a plan view, and FIG. 14B is a cross-sectional view taken along line XIVB-XIVB of FIG. 14A;

FIG. 15A illustrates the wires on the front surface side, and FIG. 15B illustrates the wires on the rear surface side.

DETAILED DESCRIPTION

Figure 1:
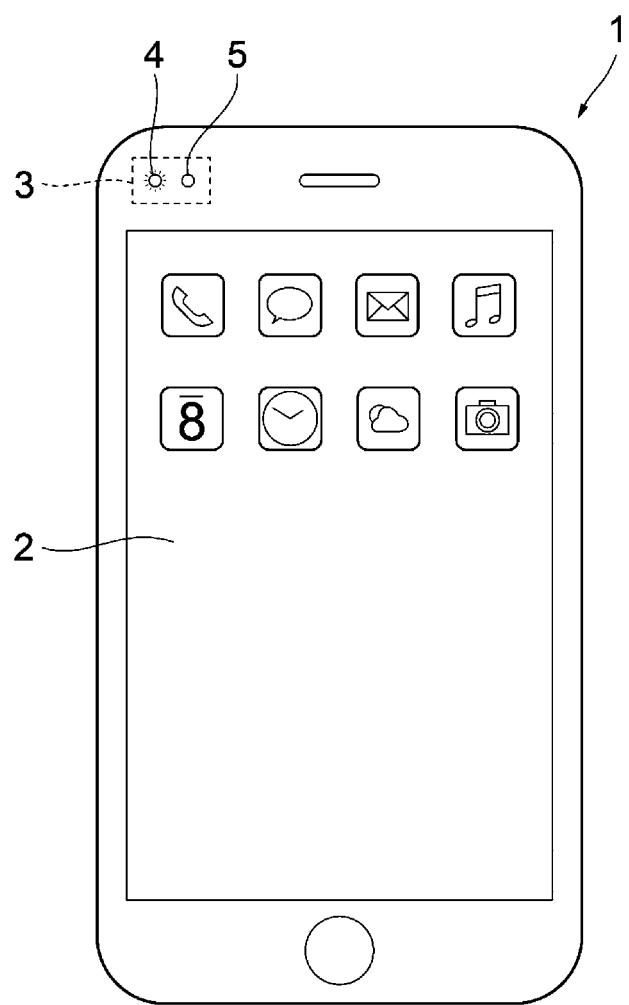
FIG. 1 illustrates an example of an information processing apparatus.

An exemplary embodiment of the present disclosure is described in detail below with reference to the attached drawings.

Some measurement devices for measuring a three-dimensional shape of an object to be measured measure a three-dimensional shape according to a Time of Flight (ToF) method using a flight time of light. The ToF method measures a period from a timing of emission of light from a light-emitting device of the measurement device to a timing of reception, by a three-dimensional sensor (hereinafter referred to as a 3D sensor) of the measurement device, of light reflected by an object to be measured and specifies a three-dimensional shape of the object to be measured from the measured three-dimensional shape. An object whose three-dimensional shape is to be measured is referred to as an object to be measured. A three-dimensional shape may be referred to as a three-dimensional image. Measurement of a three-dimensional shape may be referred to as three-dimensional measurement, 3D measurement, or 3D sensing.

Such a measurement device is mounted, for example, in a mobile information processing apparatus and is used for face authentication of a user who attempts to access the mobile information processing apparatus. Conventionally, apparatuses such as a mobile information processing apparatus authenticate a user, for example, by using a password, a fingerprint, or an iris. Recently, there are demands for an authentication method of higher security. In response to such demands, recent mobile information processing apparatuses include a measurement device for measuring a three-dimensional shape. That is, a recent mobile information processing apparatus acquires a three-dimensional shape of a face of a user who accessed the mobile information processing apparatus, determines whether or not the user has access permission, and permits the user to use the mobile information processing apparatus only in a case where the user is authenticated as a user having access permission.

In the following description, it is, for example, assumed that the information processing apparatus is a mobile information processing terminal and a user is authenticated through recognition of a shape of a face captured as a three-dimensional image. Note that the information processing apparatus may be an information processing apparatus of other kinds such as a personal computer (PC).

According to the ToF method, a measurement device measures a period from emission of light from a light-emitting device of the measurement device to reception, by a 3D sensor of the measurement device, of the light reflected by an object to be measured and is therefore required to be short in rise time of light emission from a light source. A shorter rise time of light emission means higher accuracy of measurement. A rise time of light emission from a light source becomes shorter as effective inductance of an electric current path for supplying an electric current for light emission to the light source becomes smaller. That is, as effective inductance of the electric current path becomes larger, an electric current of a high frequency becomes harder to flow, and a rise time of an electric current for light emission from the light source becomes longer accordingly. The rise time of light emission is a rise time of an electric current for light emission and is, for example, a time it takes for light emission to reach 90% of a maximum light amount from the start of rising of an electric current for light emission.

Furthermore, configurations, functions, methods, and the like described in the exemplary embodiment below can be applied to recognition of an object to be measured other than a face based on a measured three-dimensional image. Furthermore, such a measurement device is also applied to a case where a three-dimensional shape of an object to be measured is continuously measured (e.g., augmented reality (AR)). There is no restriction on a distance to the object to be measured. Although it is only necessary to radiate light to a face located close to a light source in the case of face authentication, it is required to radiate light to an object to be measured located farther than a face in cases such as augmented reality. In view of this, a light source is required to be large in light amount.

Furthermore, configurations, functions, methods, and the like described in the exemplary embodiment below can be applied to measurement of a three-dimensional shape of an object to be measured other than face authentication and augmented reality.

Information Processing Apparatus 1

FIG. 1 illustrates an example of an information processing apparatus 1. As described above, the information processing apparatus 1 is, for example, a mobile information processing terminal.

The information processing apparatus 1 includes a user interface unit (hereinafter referred to as a UI unit) 2 and an optical device 3 that measures a three-dimensional shape. The UI unit 2 is, for example, a unit in which a display device for displaying information for a user and an input device that receives an instruction concerning information processing from a user are integrated with each other. The display device is, for example, a liquid crystal display or an organic EL display, and the input device is, for example, a touch panel.

The optical device 3 includes a light-emitting device 4 and a 3D sensor 5. The light-emitting device 4 radiates light toward an object to be measured (a face in this example). The 3D sensor 5 acquires light that is emitted by the light-emitting device 4 and is then reflected back by a face. In this example, a three-dimensional shape is measured according to the Time of Flight method using a flight time of light. Then, a three-dimensional shape of the face is specified on the basis of the three-dimensional shape thus measured. Then, it is determined whether or not a user has access permission on the basis of the specified three-dimensional shape of the face, and the user is permitted to use the information processing apparatus 1 in a case where the user is authenticated as a user having access permission. As described above, the 3D sensor 5 may measure a three-dimensional shape of an object other than a face. The 3D sensor 5 is an example of a light receiving unit.

The information processing apparatus 1 is a computer including a CPU, a ROM, and a RAM. Examples of the ROM include a non-volatile rewritable memory such as a flash memory. Programs and constant numbers accumulated in the ROM are loaded into the RAM, and the CPU executes the programs. The information processing apparatus 1 thus operates and executes various kinds of information processing.

Figure 2:
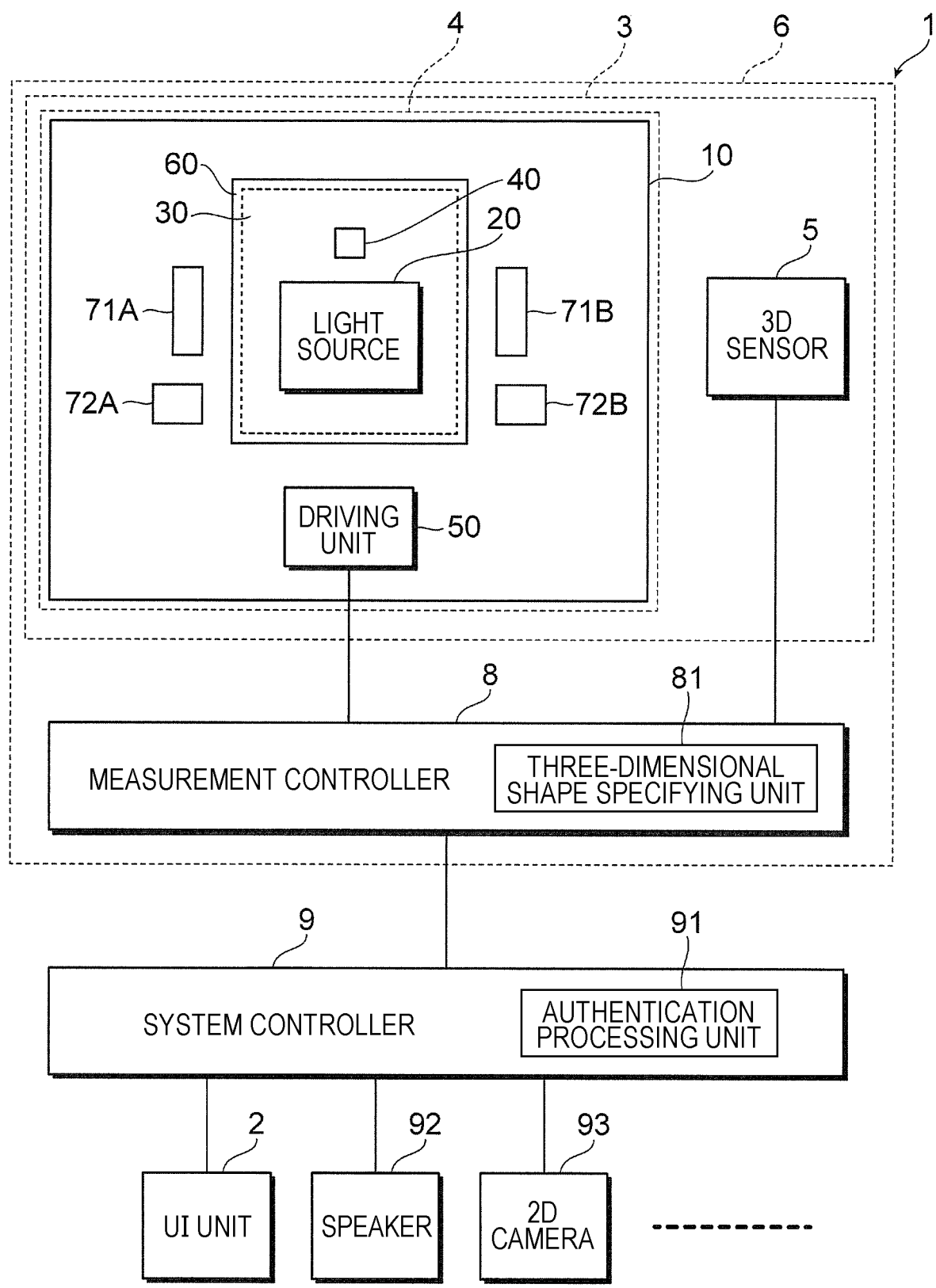
FIG. 2 is a block diagram illustrating a configuration of the information processing apparatus.

FIG. 2 is a block diagram for explaining a configuration of the information processing apparatus 1.

The information processing apparatus 1 includes the optical device 3, a measurement controller 8, and a system controller 9. As described above, the optical device 3 includes the light-emitting device 4 and the 3D sensor 5. The measurement controller 8 controls the optical device 3. The measurement controller 8 includes a three-dimensional shape specifying unit 81. The system controller 9 controls the whole information processing apparatus 1 as a system.

The system controller 9 includes an authentication processing unit 91. The system controller 9 is connected to members such as the UI unit 2, a speaker 92, and a two-dimensional camera (referred to as a 2D camera in FIG. 2) 93.

The light-emitting device 4 of the optical device 3 includes a circuit board 10, a light source 20, a light diffusion member 30, a light amount monitoring light receiving element (hereinafter referred to as PD) 40, a driving unit 50, a holding unit 60, and capacitors 71A, 71B, 72A, and 72B. The capacitors 71A and 71B are capacitors (hereinafter referred to as low-ESL capacitors) having low equivalent series inductance (ESL), and the capacitors 72A and 72B are capacitors (hereinafter referred to as non-low-ESL capacitors) having larger equivalent series inductance (ESL) than the capacitors 71A and 71B. In a case where the capacitors 71A and 71B are not distinguished from each other, the capacitors 71A and 71B are referred to as capacitors 71, and in a case where the capacitors 72A and 72B are not distinguished from each other, the capacitors 72A and 72B are referred to as capacitors 72. Furthermore, the light-emitting device 4 may include passive elements such as a resistive element and another capacitor for causing the driving element 50 to operate.

The light source 20, the PD 40, the driving unit 50, the capacitors 71 and 72, and the holding unit 60 are provided on a front surface of the circuit board 10. Although the 3D sensor 5 is not provided on the front surface of the circuit board 10 in FIG. 2, the 3D sensor 5 may be provided on the front surface of the circuit board 10. The light diffusion member 30 is provided on the holding unit 60. Note that the front surface is a front side of the paper on which FIG. 2 is drawn. More specifically, a side of the circuit board 10 on which the members such as the light source 20 are provided is referred to as a front surface, a front side, or a front surface side. The same applies to the other members. Hereinafter, seeing through members from the front surface side is referred to as top view.

The light source 20 is a surface emitting laser element array including plural surface emitting laser elements that are two-dimensionally arranged (see FIG. 3, which will be described later). The surface emitting laser elements are, for example, vertical cavity surface emitting lasers (VCSELs). In the following description, it is assumed that the surface emitting laser elements are vertical cavity surface emitting lasers (VCSELs). The vertical cavity surface emitting lasers (VCSELs) are hereinafter referred to as VCSELs. Since the light source 20 is provided on the front surface of the circuit board 10, the light source 20 emits light toward an outside in a direction perpendicular to the front surface of the circuit board 10 (toward the frontward side). A surface of the light source 20 from which light is emitted is sometimes referred to as an emission surface. The light source 20 is an example of a laser element array.

The light diffusion member 30 is provided on a light emission path of the light source 20. The light diffusion member 30 diffuses incident light emitted from the light source 20 and outputs the diffused light. The light diffusion member 30 is provided so as to cover the light source 20 and the PD 40. The light diffusion member 30 is provided so as to be spaced apart by a predetermined distance from the light source 20 and the PD 40 provided on the circuit board 10 by the holding unit 60 provided on the front surface of the circuit board 10. Accordingly, light emitted from the light source 20 reaches an object to be measured after being diffused by the light diffusion member 30. That is, the light emitted by the light source 20 is radiated in a wider range by being diffused by the light diffusion member 30 than in a case where the light diffusion member 30 is not provided. The PD 40 receives the light reflected by a rear surface of the light diffusion member 30.

The PD 40 is a photodiode made of a material such as silicon and outputs an electric signal according to an amount of received light (hereinafter referred to as a received light amount). The PD 40 is disposed so as to receive light emitted from the light sources 20 and then reflected by a rear surface (a surface on a −z direction side in FIG. 6, which will be described later) of the light diffusion member 30. The light source 20 is controlled to emit light while keeping a predetermined light amount on the basis of the amount of light received by the PD 40. That is, the measurement controller 8 monitors the amount of light received by the PD 40 and controls an amount of light emitted from the light source 20 by controlling the driving unit 50.

In a case where three-dimensional measurement is performed by using the ToF method, the light source 20 is required to emit, for example, pulsed light (hereinafter referred to as an emitted light pulse) of 100 MHz or more whose rise time is 1 ns or less by the driving unit 50. That is, the light source 20 emits an emitted light pulse by being driven by a flowing electric current. In an example of face authentication, a distance over which light is radiated is approximately 10 cm to approximately 1 m, and a range irradiated with light is approximately 1 m square. The distance over which light is radiated is referred to as a measurement distance, and the range irradiated with light is referred to as an irradiation range or a measurement range. A plane virtually provided in the irradiation range or the measurement range is referred to as an irradiation plane. In cases other than face authentication, the measurement distance to the object to be measured and the irradiation range of the object to be measured may be different from those described above.

The 3D sensor 5 includes plural light receiving cells and outputs a signal corresponding to a period from emission of light from the light source 20 to reception of the light by the 3D sensor 5. For example, each of the light receiving cells of the 3D sensor 5 receives pulsed light (hereinafter referred to as a received pulse) that is an emitted pulse from the light source 20 reflected by an object to be measured and accumulates an electric charge corresponding to a period to the reception of the light. The 3D sensor 5 is a device having a CMOS structure in which each light receiving cell includes two gates and electric charge accumulating units corresponding to the two gates. By alternately applying a pulse to the two gates, a generated photoelectron is transferred to any of the two electric charge accumulating units at a high speed. In the two electric charge accumulating units, an electric charge according to a phase difference between an emitted light pulse and a received pulse is accumulated. The 3D sensor 5 outputs, as a signal for each light receiving cell, a digital value according to a phase difference between an emitted light pulse and a received pulse through an AD converter. That is, the 3D sensor 5 outputs a signal corresponding to a period from emission of light from the light source 20 to reception of the light by the 3D sensor 5. Accordingly, a signal corresponding to a three-dimensional shape of the object to be measured is acquired from the 3D sensor 5. It is therefore required that a rise time of the emitted light pulse be short and a rise time of the received pulse be short. That is, it is required that a rise time of an electric current pulse supplied to drive the light source 20 be short. The AD converter may be provided in the 3D sensor 5 or may be provided outside the 3D sensor 5. The 3D sensor 5 is an example of a light receiving unit.

The three-dimensional shape specifying unit 81 of the measurement controller 8 acquires a digital value obtained for each light receiving cell and calculates a distance to the object to be measured for each light receiving cell in a case where the 3D sensor 5 is, for example, a device having a CMOS structure as described above. Then, the three-dimensional shape specifying unit 81 specifies a three-dimensional shape of the object to be measured based on the calculated distance and outputs the specified three-dimensional shape. The three-dimensional shape specifying unit 81 functions as a distance specifying unit that specifies a distance to an object to be measured.

The authentication processing unit 91 of the system controller 9 determines whether or not a user has access permission on the basis of the three-dimensional shape specified by the three-dimensional shape specifying unit 81 and authenticates the user in a case where the user has access permission.

In FIG. 2, the measurement device 6 includes the optical device 3 and the measurement controller 8. Although the optical device 3 and the measurement controller 8 are separate from each other in FIG. 2, the optical device 3 and the measurement controller 8 may be integral with each other.

These members are described below in order.

Configuration of Light Source 20

Figure 3:
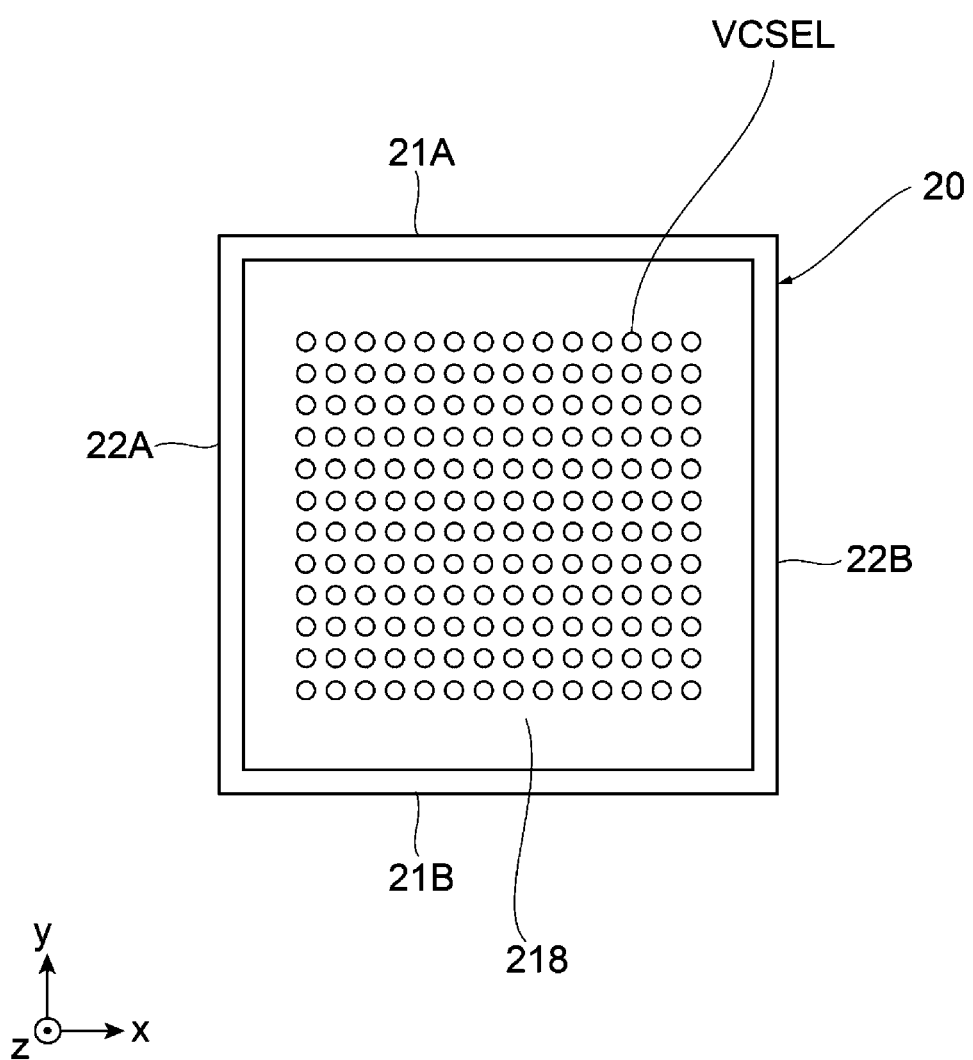
FIG. 3 is a plan view of a light source.

FIG. 3 is a plan view of the light source 20. The light source has a quadrangular planar shape. Examples of the quadrangle include a rectangle, a square, and a parallelogram. The light source 20 is constituted by plural VCSELS that are disposed in a two-dimensional array. Although the VCSELs are disposed on vertexes (grid points) of a square in FIG. 3, the VCSELs may be disposed in a different manner. As described above, the light source 20 is a surface emitting laser element array using VCSELs as surface light emitting laser elements. It is assumed that the rightward direction and the upward direction of the paper on which FIG. 3 is drawn are an x direction and a y direction, respectively. A direction orthogonal to the x direction and the y direction in anticlockwise direction is a z direction. Note that the front surface of the light source 20 is a front side of the paper on which FIG. 3 is drawn, that is, a surface on a +z direction side, and a rear surface of the light source 20 is a rear side of the paper on which FIG. 3 is drawn, that is, a surface on a −z direction side. The plan view of the light source 20 is a view illustrating the light source 20 from the front surface side. More specifically, a side of the light source 20 on which an epitaxial layer functioning as a light emission layer (an active region 206, which will be described later) is provided is referred to as a front surface, a front side, or a front surface side of the light source 20.

Each of the VCSELs is a surface emitting laser element configured such that an active region that serves as a light-emitting region is provided between a lower multilayer film reflector and an upper multilayer film reflector stacked on a semiconductor substrate 200 (see FIG. 4, which will be described later) and emits laser light in a direction perpendicular to a surface of the semiconductor substrate 200. It is therefore easier to arrange the VCSELS in a two-dimensional array than in a case where end-surface emission type laser elements are used. The number of VCSELS included in the light source 20 is, for example, 100 to 1000. The plural VCSELs are connected in parallel and are driven in parallel. The number of VCSELs described above is an example and need just be set in accordance with the measurement distance and the irradiation range.

An anode electrode 218 common to the plural VCSELs is provided on the front surface of the light source 20. A cathode electrode 214 is provided on a rear surface of the light source 20 (see FIG. 4, which will be described later). That is, the plural VCSELs are connected in parallel. In a case where the plural VCSELs are connected in parallel and driven in parallel, light of a higher intensity is emitted than in a case where the VCSELs are individually driven.

A side surface on a +y direction side, a side surface on a −y direction side, a side surface on a −x direction side, and a side surface on a +x direction side of the light source 20 are referred to as a side surface 21A, a side surface 21B, a side surface 22A, and a side surface 22B, respectively. The side surface 21A and the side surface 21B face each other. The side surface 22A and the side surface 22B connect the side surface 21A and the side surface 21B and face each other.

Structure of VCSEL

Figure 4:
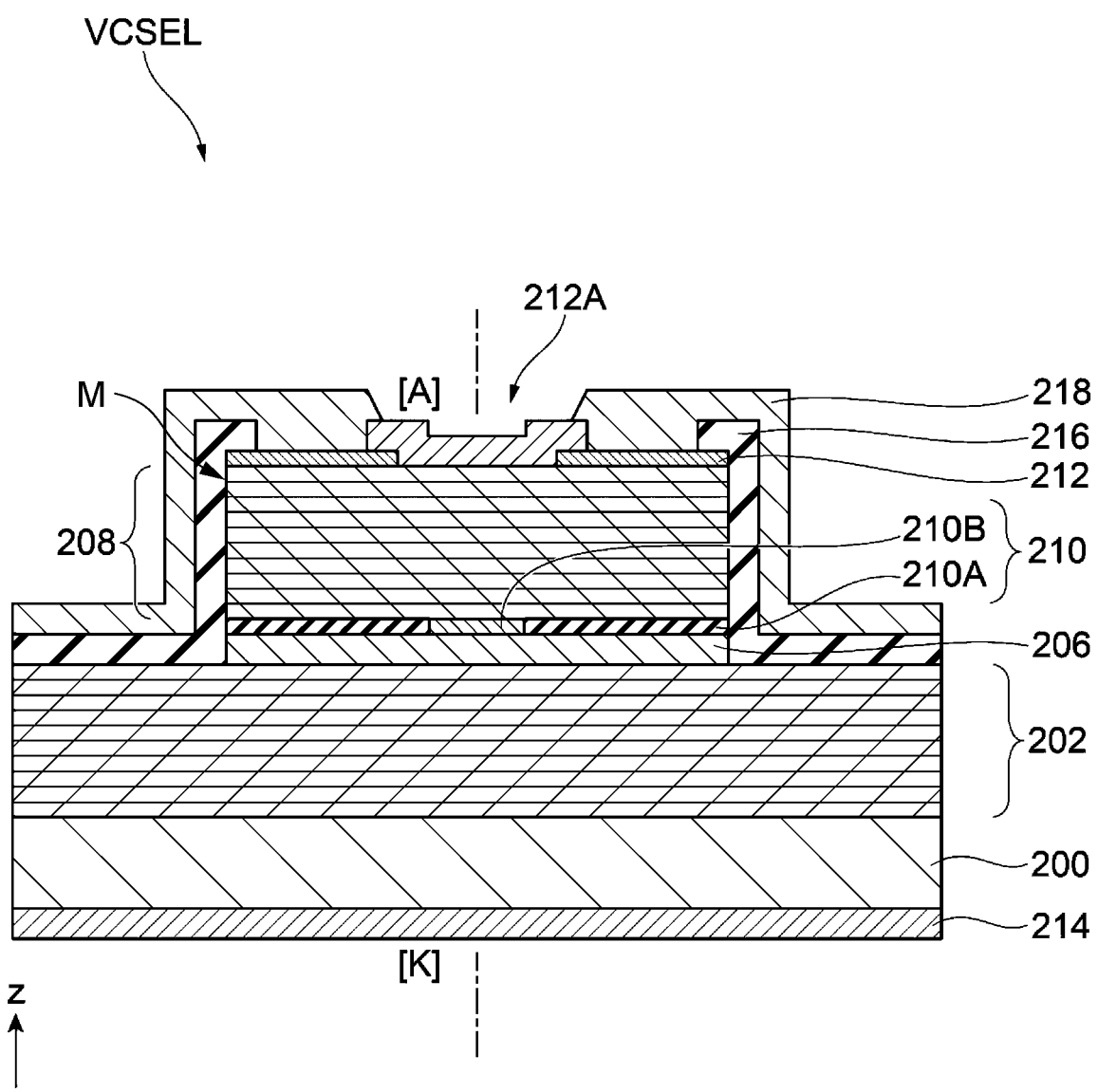
FIG. 4 is a view for explaining a cross-sectional structure of a single VCSEL of the light source.

FIG. 4 is a view for explaining an example of a cross-sectional structure of a single VCSEL in the light source 20. The VCSEL is a VCSEL having a $\lambda$ resonator structure. The upward direction of the paper on which FIG. 4 is drawn is the z direction, and a +z direction is referred to as an upper side, and a −z direction is referred to as a lower side.

The VCSEL is configured such that an n-type lower distributed bragg reflector (DBR) 202 in which AlGaAs layers having different Al compositions are alternately stacked, an active region 206 including a quantum well layer sandwiched between an upper spacer layer and a lower spacer layer, and a p-type upper distributed bragg reflector 208 in which AlGaAs layers having different Al compositions are alternately stacked are stacked in order on the semiconductor substrate 200 such as n-type GaAs. Hereinafter, a distributed bragg reflector is referred to as a DBR.

The n-type lower DBR 202 is a multilayer body including pairs of an $Al_{0.9}Ga_{0.1}As$ layer and an GaAs layer, each of the layers has a thickness of $\lambda/4n_r$ ($\lambda$ is an oscillation wavelength, and $n_r$ is a refractive index of a medium), and 40 pairs of these layers are stacked so that these layers are alternately provided. The n-type lower DBR 202 is doped with silicon (Si), which is an n-type impurity, as a carrier. A carrier concentration, is, for example, $3\times10^{18}$ $cm^{-3}$.

The active region 206 is configured such that the lower spacer layer, the quantum well active layer, and the upper spacer layer are stacked. For example, the lower spacer layer is an undoped $Al_{0.6}Ga_{0.4}As$ layer, the quantum well active layer is an undoped InGaAs quantum well layer and an undoped GaAs barrier layer, and the upper spacer layer is an undoped $Al_{0.6}Ga_{0.4}As$ layer.

The p-type upper DBR 208 is a multilayer body including pairs of a p-type $Al_{0.9}Ga_{0.1}As$ layer and a GaAs layer. Each of the layers of the p-type upper DBR 208 has a thickness of $\lambda/4n_r$, and 29 pairs of these layers are stacked so that these layers are alternately provided. The p-type upper DBR 208 is doped with carbon (C), which is a p-type impurity, as a carrier. A carrier concentration is, for example, $3\times10^{18}$ $cm^{-3}$. Desirably, a contact layer made of p-type GaAs is formed in a topmost layer of the upper DBR 208, and a p-type AlAs current confinement layer 210 is formed in a lowermost layer of the upper DBR 208 or in an inner part of the upper DBR 208.

By etching a semiconductor layer stacked from the upper DBR 208 to the lower DBR 202, a cylindrical mesa M is formed on the semiconductor substrate 200. This causes the current confinement layer 210 to be exposed on a side surface of the mesa M. An oxidized region 210A oxidized from the side surface of the mesa M and an electrically-conductive region 210B surrounded by the oxidized region 210A are formed in the current confinement layer 210 by an oxidation process. In the oxidation process, an oxidation speed of the AlAs layer is higher than an oxidation speed of the AlGaAs layer, and the oxidized region 210A is oxidized from the side surface of the mesa M toward an inside of the mesa M at an almost constant speed, and therefore a cross-sectional shape of the electrically-conductive region 210B becomes a shape reflecting an external shape of the mesa M, i.e., a circular shape, and a center of the shape almost matches an axis (indicated by the line with alternate long and short dashes) of the mesa M. In the present exemplary embodiment, the mesa M has a columnar structure.

An annular p-side electrode 212 made of a metal in which Ti/Au and the like are stacked is formed in a topmost layer of the mesa M. The p-side electrode 212 makes ohmic-contact with the contact layer provided in the upper DBR 208. An inner side of the annular p-side electrode 212 serves as a light outlet 212A through which laser light is emitted to an outside. That is, the VCSEL emits light in a +z direction perpendicular to a front surface (a surface on the +z direction side) of the semiconductor substrate 200. The axis of the mesa M is an optical axis. Furthermore, the cathode electrode 214 is formed as an n-side electrode on the rear surface of the semiconductor substrate 200. Note that a front surface (a surface on the +z direction side) of the upper DBR 208 on an inner side of the p-side electrode 212 is a light emission surface.

An insulating layer 216 is provided so as to cover the front surface of the mesa M excluding a part of the p-side electrode 212 to which the anode electrode 218 is connected and the light outlet 212A. The anode electrode 218 is provided so as to make ohmic-contact with the p-side electrode 212 excluding the light outlet 212A. The anode electrode 218 is provided common to the plural VCSELs. That is, the p-side electrodes 212 of the plural VCSELs that constitute the light source 20 are connected in parallel by the anode electrode 218.

In FIG. 4, the anode electrode 218 is indicated by [A] indicative of an anode, and the cathode electrode 214 is indicated by [K] indicative of a cathode.

The VCSEL may oscillate in a single transverse mode or may oscillate in a multiple transverse mode. Light output of a single VCSEL is, for example, 4 mW to 8 mW. Accordingly, for example, in a case where the light source 20 is constituted by 500 VCSELs, light output of the light source 20 is 2 W to 4 W.

Configuration of Light Diffusion Member 30

Figure 5A:
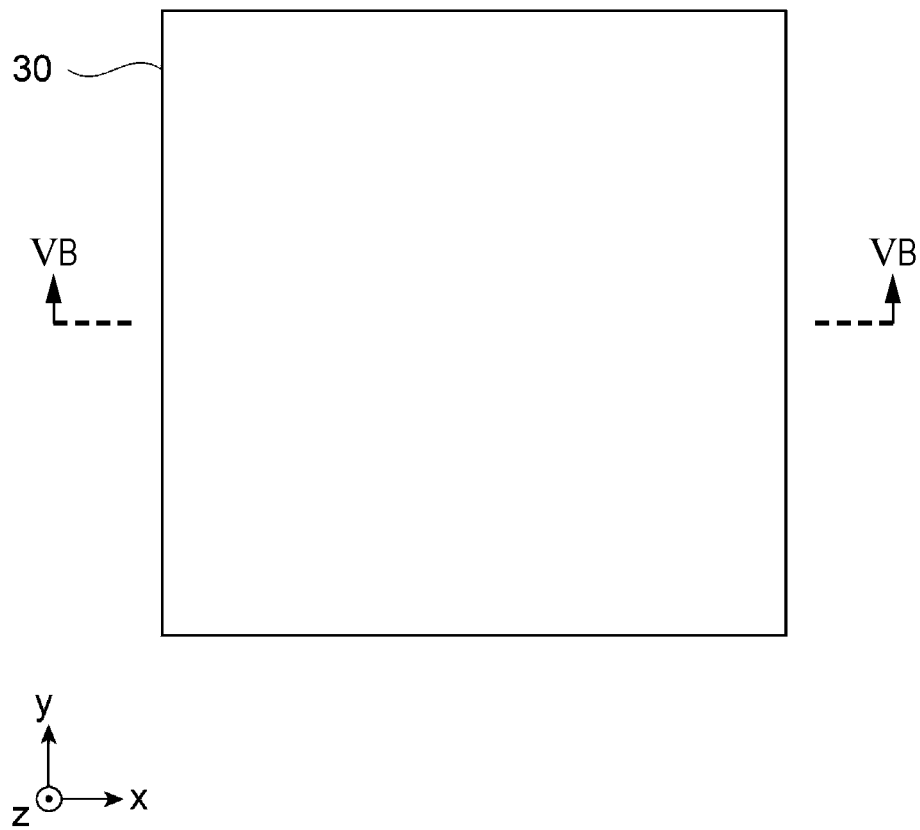
FIGS. 5A and 5B are views for explaining an example of a light diffusion member.
Figure 5B:
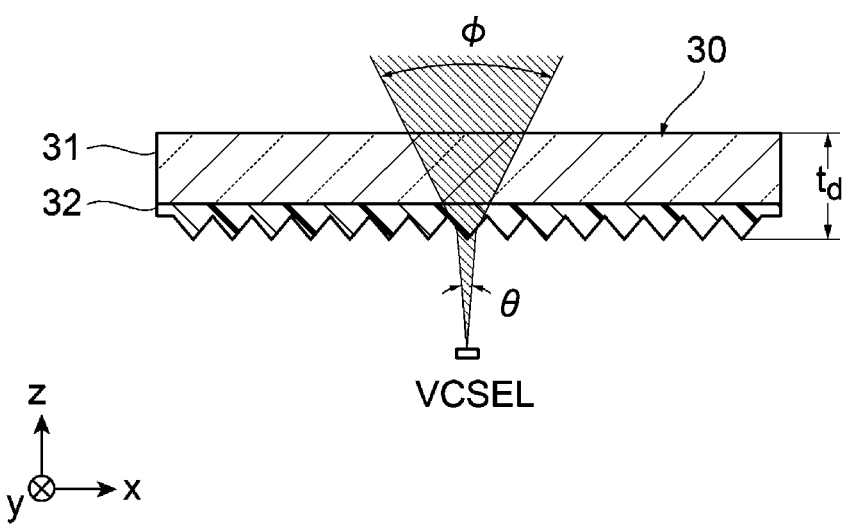

FIGS. 5A and 5B are views for explaining an example of the light diffusion member 30. FIG. 5A is a plan view, and FIG. 5B is a cross-sectional view taken along line VB-VB of FIG. 5A. In FIG. 5A, it is assumed that the rightward direction, the upward direction, and the frontward direction of the paper on which FIG. 5A is drawn are the x direction, the y direction, and the z direction, respectively. A surface of the light diffusion member 30 on the +z direction side is referred to as a front surface or a front surface side, and a surface of the light diffusion member 30 on the −z direction side is referred to as a rear surface or a rear surface side. Accordingly, in FIG. 5B, the rightward direction, the depth direction, and the upward direction of the paper on which FIG. 5B is drawn are the x direction, the y direction, and the z direction, respectively.

As illustrated in FIG. 5B, the light diffusion member 30 includes a resin layer 32 having irregularities for diffusing light, for example, on a rear surface (−z direction) side of a glass substrate 31 whose both surfaces are parallel and flat. The light diffusion member 30 widens a spread angle of light incident from the VCSELs of the light source 20. That is, the irregularities of the resin layer 32 of the light diffusion member 30 refract and scatter light so that incident light is output as light having a wider spread angle. That is, as illustrated in FIG. 5B, the light diffusion member 30 causes light having a spread angle $\theta$ emitted from the VCSELs and incident from the rear surface (−z direction side) to be output as light having a spread angle $\varphi$, which is larger than $\theta$, from the front surface (+z direction side) ($\theta<\varphi$). This means that use of the light diffusion member 30 increases an area of an irradiation surface irradiated with light emitted from the light source 20 as compared with a case where the light diffusion member 30 is not used. The spread angles $\theta$ and $\varphi$ are full width at half maximum (FWHM).

The light diffusion member 30 is, for example, configured such that a planar shape thereof is a quadrangle and a thickness $t_d$ (a thickness in the z direction) thereof is 0.1 mm to 1 mm. The planar shape of the light diffusion member 30 may be any of other shapes such as a polygonal shape or a circular shape.

Driving Unit 50 and Capacitors 71 and 72

In a case where the light source 20 is driven at a higher speed, the light source 20 is desirably driven by low-side driving. The low-side driving refers to a configuration in which a driving element such as an MOS transistor is located on a downstream side of a path through which an electric current flows (hereinafter referred to as an electric current path) relative to a target to be driven such as a VCSEL. Conversely, a configuration in which a driving element is located on an upstream side is referred to as high-side driving.

Figure 6:
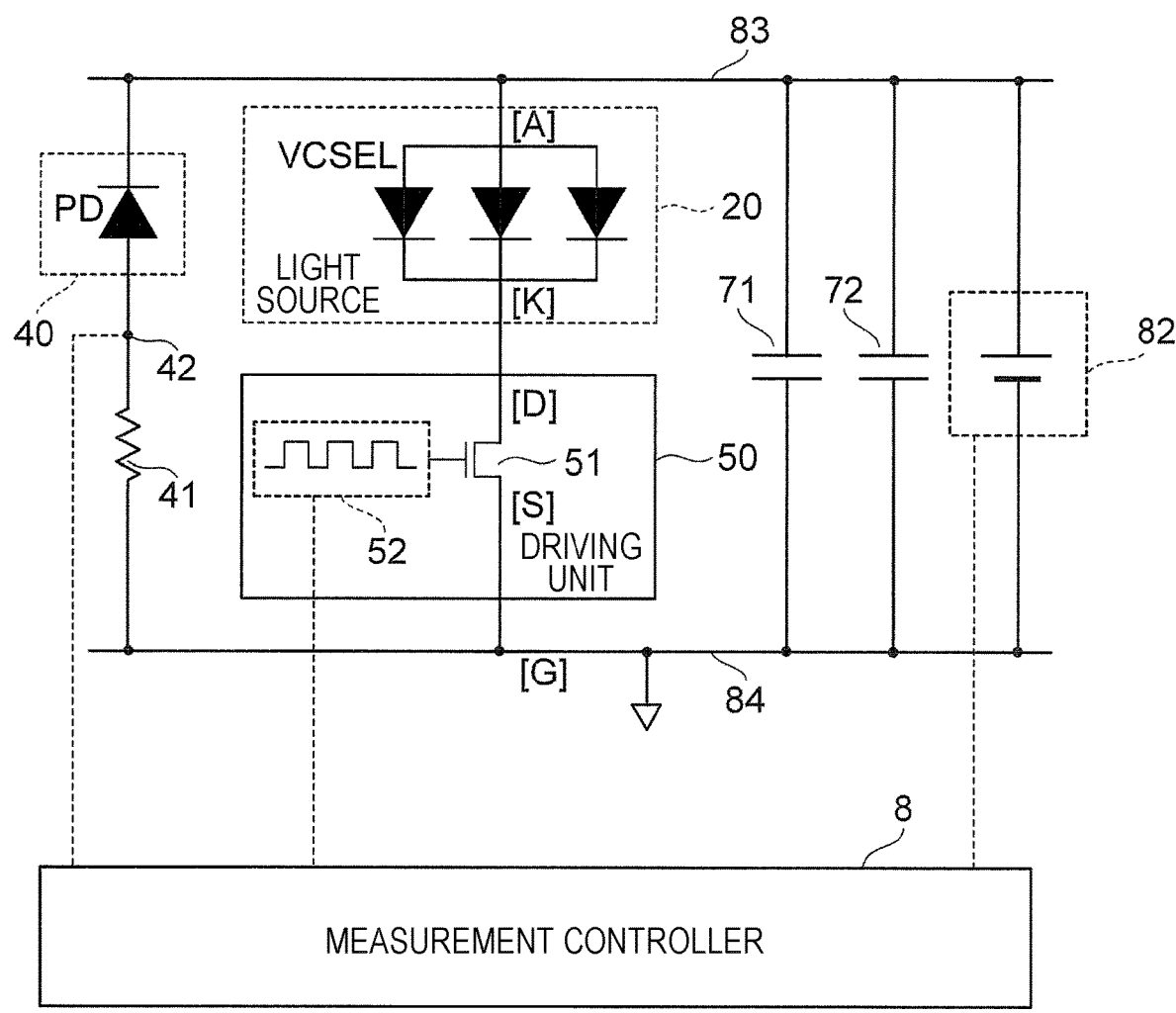
FIG. 6 illustrates an example of an equivalent circuit for driving the light source by low-side driving.

FIG. 6 illustrates an example of an equivalent circuit for driving the light source 20 by low-side driving. FIG. 6 illustrates VCSELs of the light source 20, the driving unit 50, the capacitors 71 and 72, and a power source 82. The measurement controller 8 illustrated in FIG. 2 is also illustrated in FIG. 6. The power source 82 is provided in the measurement controller 8. The power source 82 generates a direct-current voltage whose +side is a power source potential and whose −side is a reference potential. The power source potential is supplied to a power source line 83, and the reference potential is supplied to a reference line 84. The reference potential may be a ground potential (also referred to as GND; indicated by "G" in FIG. 6).

The light source 20 is constituted by plural VCSELs that are connected in parallel, as described above. The anode electrode 218 (see FIG. 4; indicated by [A] in FIG. 6) of the VCSELs is connected to the power source line 83.

The driving unit 50 includes an n-channel MOS transistor 51 and a signal generating circuit 52 that turns the MOS transistor 51 on an off. A drain (indicated by [D] in FIG. 6) of the MOS transistor 51 is connected to the cathode electrode 214 (see FIG. 4; indicated by [K] in FIG. 6)) of the VCSELs. A source (indicated by [S] in FIG. 6) of the MOS transistor 51 is connected to the reference line 84. A gate of the MOS transistor 51 is connected to the signal generating circuit 52. That is, the VCSELs and the MOS transistor 51 of the driving unit 50 are connected in series between the power source line 83 and the reference line 84. The signal generating circuit 52 generates an "H level" signal that turns the MOS transistor 51 on and an "L level" signal that turns the MOS transistor 51 off under control of the measurement controller 8.

One terminal of the capacitor 71 and one terminal of the capacitor 72 are connected to the power source line 83 ([A]

of the VCSELs in FIG. 6), and the other terminal of the capacitor 71 and the other terminal of the capacitor 72 are connected to the reference line 84 ([G] in FIG. 6).

A cathode of the PD 40 is connected to the power source line 83, and an anode of the PD 40 is connected to one terminal of a detection resistive element 41. The other terminal of the detection resistive element 41 is connected to the reference line 84. That is, the PD 40 and the detection resistive element 41 are connected in series between the power source line 83 and the reference line 84. An output terminal 42, which is a connection point between the PD 40 and the detection resistive element 41, is connected to the measurement controller 8. The output terminal 42 transmits an electric signal corresponding to an amount of light received by the PD 40 to the measurement controller 8.

Next, a driving method for driving the light source 20 by low-side driving is described.

First, it is assumed that a signal generated by the signal generating circuit 52 of the driving unit 50 is an "L level". In this case, the MOS transistor 51 is in an off state. That is, no electric current flows between the source (indicated by [S] in FIG. 6) and the drain (indicated by [D] in FIG. 6) of the MOS transistor 51. Accordingly, no electric current flows through the VCSELs that are connected in series with the MOS transistor 51. That is, the VCSELS do not emit light.

In this state, the capacitors 71 and 72 are connected to the power source 82, the one terminal (a terminal on the [A] side of the VCSELs in FIG. 6) of the capacitor 71 and the one terminal (a terminal on the [A] side of the VCSELS in FIG. 6) of the capacitor 72 that are connected to the power source line 83 become a power source potential, and the other terminal (a terminal on the [G] side of the VCSELS in FIG. 6) of the capacitor 71 and the other terminal (a terminal on the [G] side of the VCSELs in FIG. 6) of the capacitor 72 that are connected to the reference line 84 become a reference potential. Accordingly, the capacitors 71 and 72 are charged with an electric current flowing (an electric charge supplied) from the power source 82.

Next, when the signal generated by the signal generating circuit 52 of the driving unit 50 becomes an "H level", the MOS transistor 51 shifts from an off state to an on state. As a result, the capacitors 71 and 72, and the MOS transistor 51 and the VCSELs that are connected in series constitute a closed loop. This causes the electric charge accumulated in the capacitors 71 and 72 to be supplied to the MOS transistor 51 and the VCSELs that are connected in series. That is, an electric current flows through the VCSELs, and the VCSELs emit light. This closed loop is a path (sometimes referred to as an electric current path) along which an electric current for causing the light source 20 to emit light is supplied. Since an electric current for causing the light source 20 to emit light is supplied to each of the capacitors 71 and 72, the electric current path is provided for each of the capacitors 71 and 72. Causing an electric current for light emission of the light source 20 to flow is sometimes referred to as driving the light source 20.

Then, when the signal generated by the signal generating circuit 52 of the driving unit 50 becomes an "L level" again, the MOS transistor 51 shifts from an on state to an off state. This opens the closed loop (electric current path) constituted by the capacitors 71 and 72, and the MOS transistor 51 and the VCSELs that are connected in series. As a result, an electric current does not flow through the VCSELs. Accordingly, the VCSELs stop light emission. The capacitors 71 and 72 are charged with an electric current flowing (an electric charge supplied) from the power source 82.

As described above, when the signal output by the signal generating circuit 52 repeatedly switches between the "H level" and the "L level", the MOS transistor 51 repeatedly turns on and off, and the VCSELs repeatedly switch between light emission and non-light-emission. The repeated on and off of the MOS transistor 51 is sometimes referred to as switching.

As described above, by discharging the electric charges accumulated in the capacitors 71 and 72 at once when the MOS transistor 51 is shifted from an off state to an on state, an electric current for light emission is supplied to the VCSELs so that the VCSELs emit light in a short rise time. As described above, the capacitors 71 are low-ESL capacitors, and the capacitors 72 are non-low-ESL capacitors.

The low-ESL capacitor often has a small capacity although a planar shape thereof is large (a mount area thereof on the circuit board 10 is large). Meanwhile, the non-low-ESL capacitor, which uses a ceramic sheet of a high dielectric constant, often has a large capacity although a planar shape thereof is small (a mount area thereof on the circuit board 10 is small). In view of this, the capacitors 71, which are low-ESL capacitors, and the capacitors 72, which are non-low-ESL capacitors, are used in combination. That is, an electric current at a time of rising of light emission of the light source 20 is supplied by the capacitors 71, which are low-ESL capacitors having a small capacity, and an electric current for securing a light amount after rising of light emission is supplied by the capacitors 72, which are non-low-ESL capacitors having a large capacity. This shortens a rise time of light emission and secures a light amount. The low-ESL capacitor is typically longer in width (W) than in length (L) (an electrode-to-electrode length) and is therefore sometimes called a LW-reverse-type capacitor. Meanwhile, the non-low-ESL capacitor typically is shorter in width (W) than in length (L) (an electrode-to-electrode length).

Light-Emitting Device 4

Next, the light-emitting device 4 is described in detail.

Figure 7A:
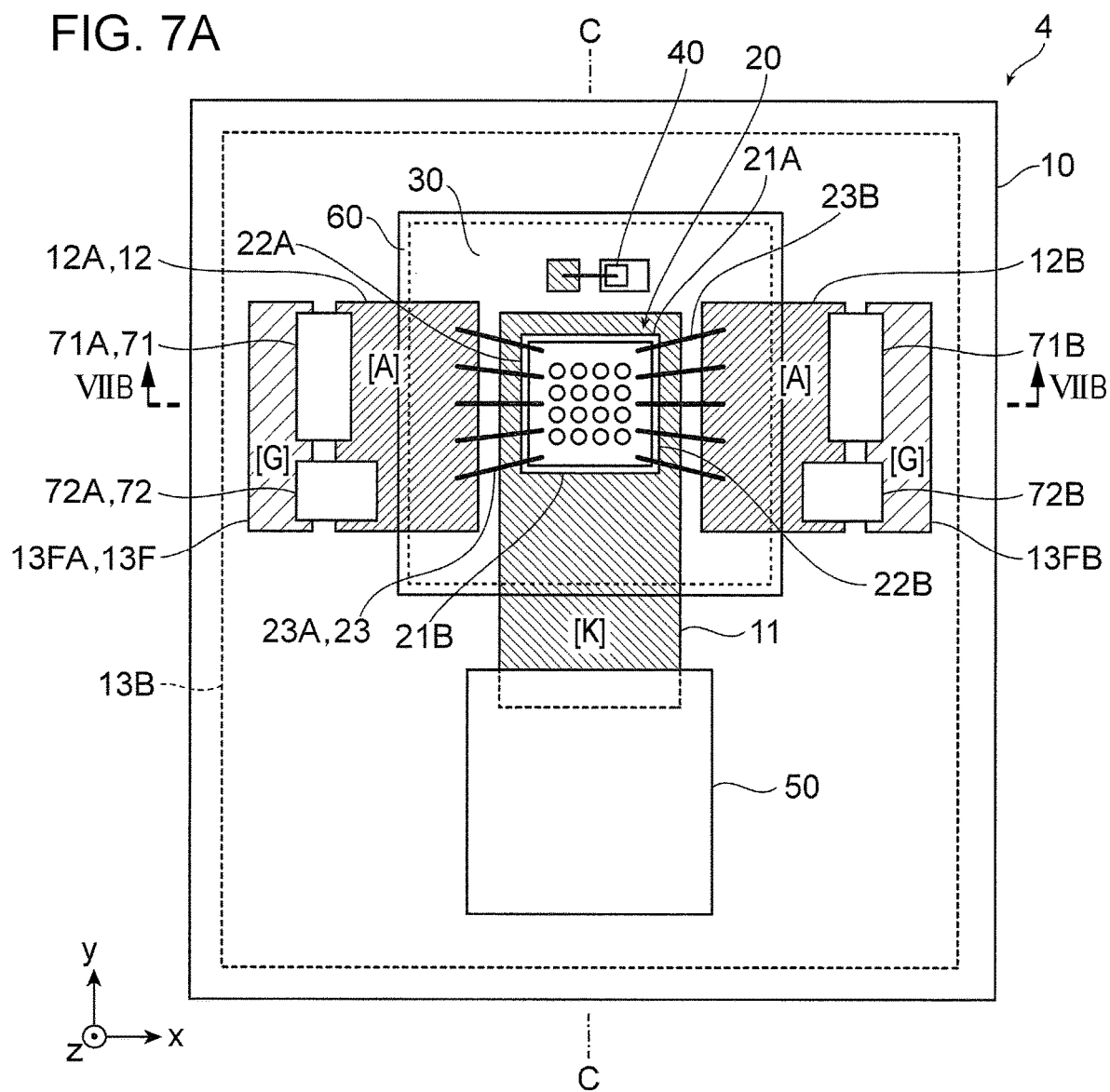
FIGS. 7A and 7B are views for explaining a light-emitting device to which the present exemplary embodiment is applied.
Figure 7B:
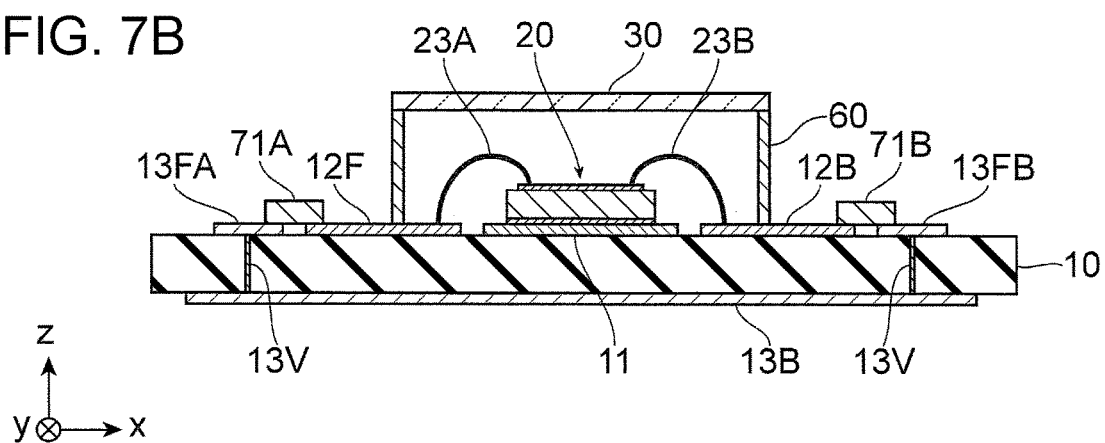

FIGS. 7A and 7B are views for explaining the light-emitting device 4 to which the present exemplary embodiment is applied. FIG. 7A is a plan view, and FIG. 7B is a cross-sectional view taken along line VIIB-VIIB of FIG. 7A. FIG. 7A is a top view seen through the light diffusion member 30. In FIG. 7A, it is assumed that the rightward direction, the upward direction, and the frontward direction of the paper on which FIG. 7A is drawn are the x direction, the y direction, and the z direction, respectively. In FIG. 7B, the rightward direction, the depth direction, and the upward direction of the paper on which FIG. 7B is drawn are the x direction, the y direction, and the z direction, respectively.

As illustrated in FIGS. 7A and 7B, the light source 20, the PD 40, the driving unit 50, the capacitors 71 and 72 (capacitors 71A, 71B, 72A, and 72B), and the holding unit 60 are provided on the front surface of the circuit board 10. The light diffusion member 30 is provided on the holding unit 60.

The circuit board 10 is, for example, configured such that a wiring layer in which wires made of a metal such as a copper (Cu) foil are provided is provided on an insulating base member (hereinafter sometimes referred to as an insulating layer) made of a material such as a glass epoxy resin. Note that the wires are conductive patterns connected to an electric circuit, and a shape thereof is not limited. It is assumed here that the circuit board 10 is a printed wiring board having two wiring layers. Examples of the base member made of a material such as a glass epoxy resin include a glass composite substrate (CEM-3) and a glass epoxy substrate (FR-4).

A cathode wire 11, anode wires 12A and 12B, and reference potential wires 13FA and 13FB are provided on the front surface side of the circuit board 10. The cathode wire 11 has a quadrangular planar shape and is provided in a central part of the circuit board 10. The anode wires 12A and 12B are provided so as to sandwich the cathode wire 11 in the x direction. The reference potential wires 13FA and 13FB are provided on outer sides of the anode wires 12A and 12B so as to sandwich the cathode wire 11 in the x direction. In a case where the anode wires 12A and 12B are not distinguished from each other, the anode wires 12A and 12B are referred to as anode wires 12. Similarly, in a case where the reference potential wires 13FA and 13FB are not distinguished from each other, the reference potential wires 13FA and 13FB are referred to as reference potential wires 13F. A reference potential wire 13B is provided on a rear surface of the circuit board 10. The reference potential wire 13B (indicated by the broken line in FIG. 7A) is provided on the entire rear surface of the circuit board 10. That is, the reference potential wire 13B is provided as a reference potential wire layer. The reference potential wires 13F and the reference potential wire 13B are connected to each other through a through conductor 13V provided through a base member of the circuit board 10. A through conductor is a conductor obtained by filling a hole formed through an electrically insulating base member that constitutes the circuit board 10 with a material such as copper (Cu) and electrically connects a wire provided on a front surface side of the base member of the circuit board 10 and a wire provided on a rear surface side of the base member of the circuit board 10. Note that the through conductor is also called a via.

Although the reference potential wire 13B is provided on the rear surface of the circuit board 10 in the above description, the reference potential wire 13B may be disposed in the circuit board 10 as a reference potential wire layer so as to occupy a wide area of the circuit board 10.

The cathode wire 11 provided on the front surface of the circuit board 10 is configured such that one end thereof is connected to the driving unit 50 with use of an electrically conductive member such as solder or silver paste and the light source 20 is mounted on the other end thereof, which is connected to the cathode electrode 214 (see FIG. 4) of the light source 20.

The anode wires 12A and 12B are connected to the anode electrode 218 (see FIG. 4) of the light source 20 by bonding wires 23A and 23B. In a case where the bonding wires 23A and 23B are not distinguished from each other, the bonding wires 23A and 23B are referred to as bonding wires 23. The capacitors 71A and 72A are provided between the anode wire 12A and the reference potential wire 13FA, and the capacitors 71B and 72B are provided between the anode wire 12B and the reference potential wire 13FB.

As illustrated in FIG. 7A, the capacitors 71A and 72A and the capacitors 71B and 72B are provided so as to sandwich the light source 20 in the x direction. That is, the capacitors 71A and 72A and the capacitors 71B and 72B are disposed symmetrically with respect to a central line C-C of the light source 20 in the x direction. Specifically, the capacitors 71A and 72A are provided on a side surface 22A side of the light source 20, and the capacitors 71B and 72B are provided on a side surface 22B side of the light source 20. The driving unit 50 is provided on a −y direction side of the light source 20 so as to be located on the central line C-C of the light source 20 in the x direction. Specifically, the driving unit 50 is provided on a side surface 21B side of the light source 20. The PD 40 is provided on a y direction side of the light source 20. That is, the PD 40 and the driving unit 50 are provided so as to sandwich the light source 20 in the y direction.

As described above, the light source 20, the capacitors 71A, 71B, 72A, and 72B, and the driving unit 50 are disposed so as to form a T-shape. Description of the PD 40 is omitted below.

Figure 8:
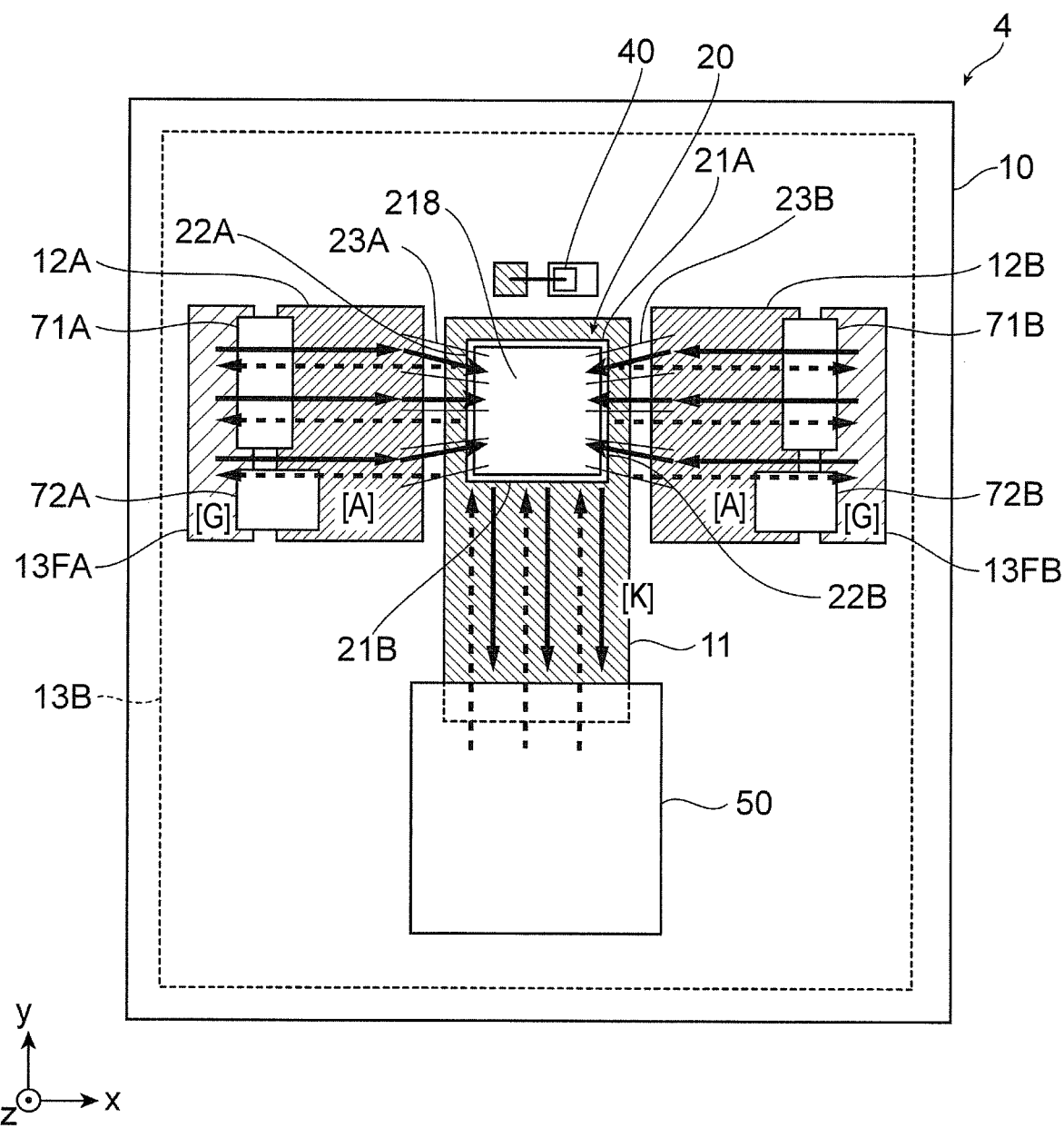
FIG. 8 is a view for schematically explaining electric current paths in the light-emitting device.

FIG. 8 is a view for schematically explaining electric current paths in the light-emitting device 4. In FIG. 8, the solid arrows indicate a path (electric current path) of an electric current flowing on the front surface side of the circuit board 10, and the broken arrows indicate a path (electric current path) of an electric current flowing through the reference potential wire 13B provided on the rear surface side of the circuit board 10. The electric current flowing through the reference potential wire 13B is sometimes referred to as a return electric current. These electric current paths are found by simulation. In FIG. 8, the bonding wires 23 are indicated by the thin lines. Description of the light diffusion member 30 is omitted.

As illustrated in FIG. 8, an electric current flows from the capacitors 71A and 72A to the anode electrode 218 of the light source 20 through the anode wire 12A and the bonding wire 23A. Similarly, an electric current flows from the capacitors 71B and 72B to the anode electrode 218 of the light source 20 through the anode wire 12B and the bonding wire 23B. Then, the electric current flows from the light source 20 to the driving unit 50 through the cathode wire 11. Then, the electric current returns to the light source 20 side from the driving unit 50 through the reference potential wire 13B on the rear surface side of the circuit board 10 along the cathode wire 11 on the front surface side. Then, the electric current returns to the capacitors 71A and 72A along the anode wire 12A on the front surface side. Concurrently, the electric current returns to the capacitors 71B and 72B along the anode wire 12B on the front surface side.

As described above, in the light-emitting device 4 to which the present exemplary embodiment is applied, an electric current does not flow over a wide range of the reference potential wire 13B but flows through an electric current path that is determined by layout of the light source 20, the capacitors 71 and 72, and the driving unit 50 although the reference potential wires 13B is provided on the entire rear surface of the circuit board 10. In the light-emitting device 4, the electric current path in the reference potential wire 13B on the rear surface side of the circuit board 10 is provided so as to face the electric current paths extending from the capacitors 71 and 72 to the light source 20 through the anode wires 12A and 12B and the electric current path extending from the light source 20 to the driving unit 50 through the cathode wire 11 on the front surface of the circuit board 10. Furthermore, the electric current flows through the whole light source 20 from the anode electrode 218 to the cathode electrode 214. That is, the electric current flows at minimum impedance, and therefore effective inductance of the electric current path is reduced, and variations in light emission of the light source 20 are suppressed.

Next, a light-emitting device 4', which is a modification of the light-emitting device 4 to which the present exemplary embodiment is applied, is described.

Figure 9A:
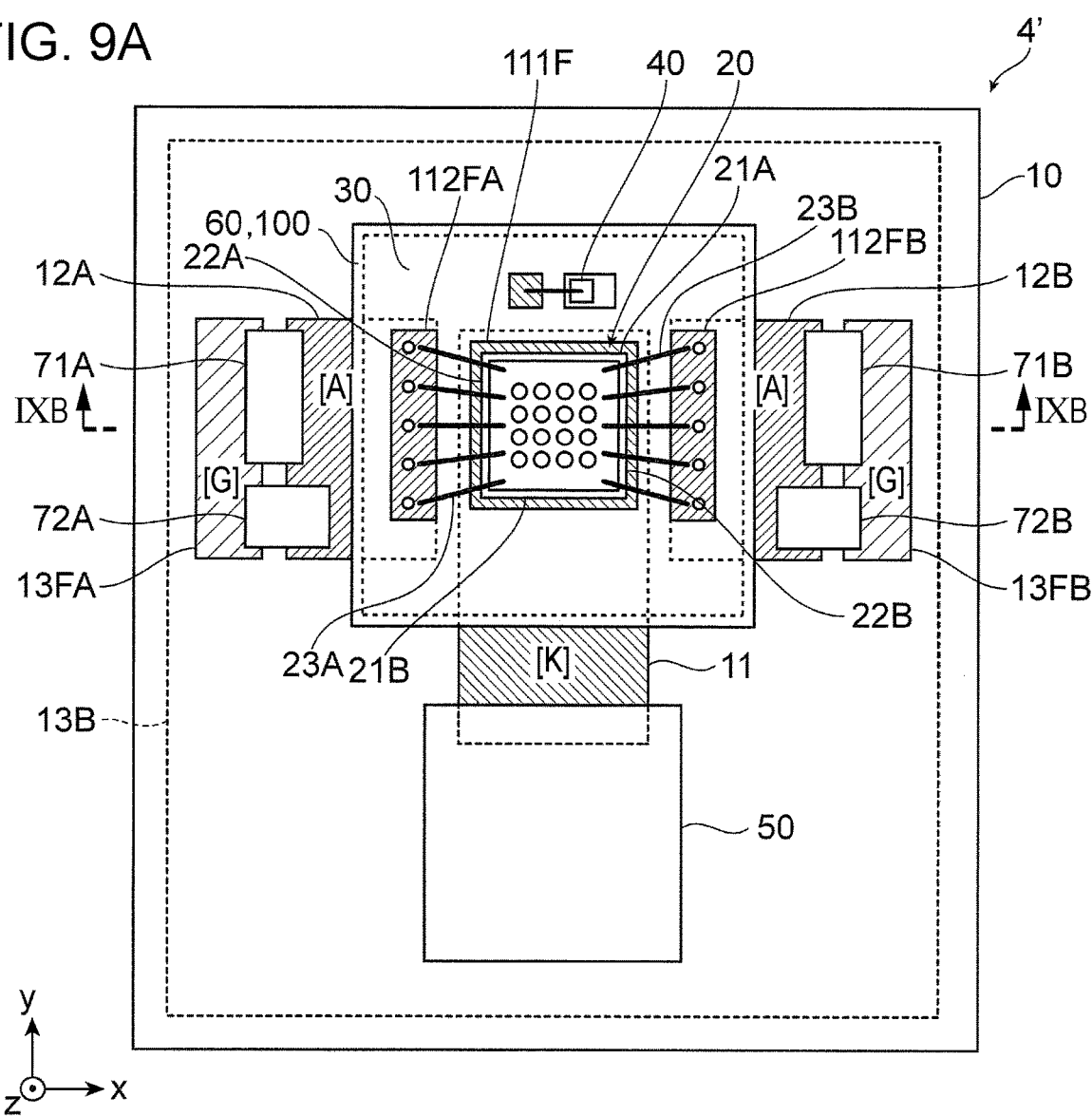
FIGS. 9A and 9B are views for explaining a light-emitting device which is a modification of the light-emitting device to which the present exemplary embodiment is applied.
Figure 9B:
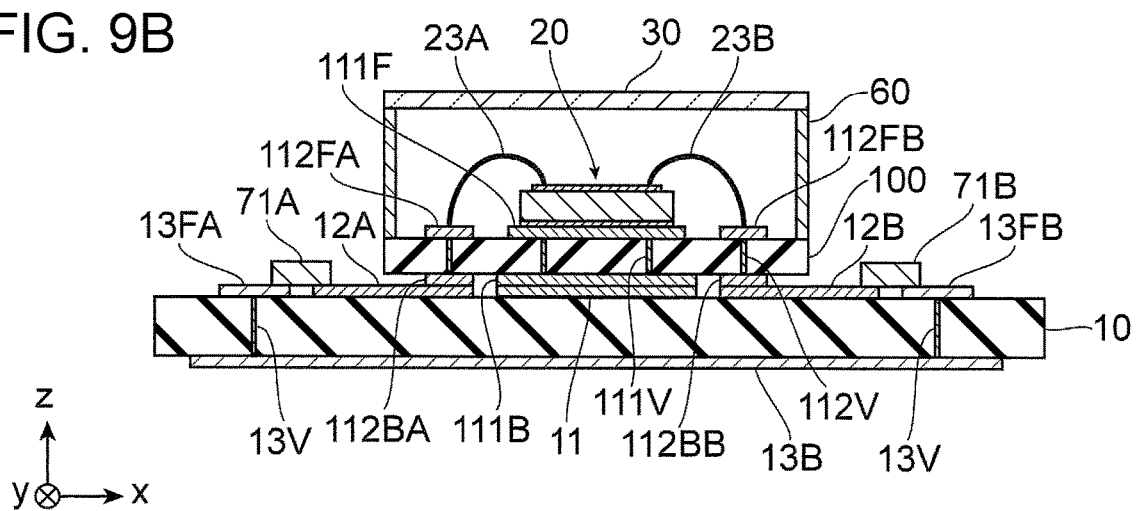

FIGS. 9A and 9B are views for explaining the light-emitting device 4', which is a modification of the light-emitting device 4 to which the present exemplary embodiment is applied. FIG. 9A is a plan view, and FIG. 9B is a cross-sectional view taken along line IXB-IXB of FIG. 9A. FIG. 9A is a top view seen through the light diffusion member 30. The light-emitting device 4' further includes a heat releasing base member 100 in addition to the constituent elements of the light-emitting device 4. Except for this, the light-emitting device 4' is similar to the light-emitting device 4, and similar parts are given identical reference signs, and description thereof is omitted. The following describes the heat releasing base member 100, which is a difference from the light-emitting device 4.

The heat releasing base member 100 is an insulating base member having higher thermal conductivity than the circuit board 10. As a light intensity of the light source 20 becomes larger, an amount of heat generated by the light source 20 becomes larger. In view of this, the light source 20 is desirably mounted on the heat releasing base member 100 to efficiently release heat generated by the light source 20.

One example of a base member made of a glass epoxy resin used for the circuit board 10 is FR-4, which has a thickness of approximately 100 μm and has thermal conductivity of approximately 0.4 W/m·K. Note that thermal conductivity of copper (Cu) is approximately 360 W/m·K. The thermal conductivity is a value at 25° C. unless otherwise specified.

For example, the thermal conductivity of the heat releasing base member 100 is preferably 10 W/m·K or more, more preferably 50 W/m·K or more, still more preferably 100 W/m·K or more. A material having thermal conductivity of 10 W/m·K or more is, for example, alumina ($Al_2O_3$) having thermal conductivity of 20 W/m·K to 30 W/m·K. A material having thermal conductivity of 50 W/m·K or more is, for example, silicon nitride ($Si_3N_4$) having thermal conductivity of approximately 85 W/m·K. A material having thermal conductivity of 100 W/m·K or more is, for example, aluminum nitride (AlN) having thermal conductivity of 150 W/m·K to 250 W/m·K. These materials are sometimes referred to as ceramic materials. The whole heat releasing base member 100 is desirably made of a ceramic material. The heat releasing base member 100 may be made of an insulating material of other kinds having high thermal conductivity such as silicon (Si) doped with no impurity. In this example, it is assumed that the heat releasing base member 100 is aluminum nitride (AlN).

As illustrated in FIGS. 9A and 9B, a cathode wire 111F and anode wires 112FA and 112FB are provided on a front surface side of the heat releasing base member 100, and a cathode wire 111B and anode wires 112BA and 112BB are provided on a rear surface side of the heat releasing base member 100. In a case where the anode wires 112FA and 112FB are not distinguished from each other, the anode wires 112FA and 112FB are referred to as anode wires 112F, and in a case where the anode wires 112BA and 112BB are not distinguished from each other, the anode wires 112BA and 112BB are referred to as anode wires 112B. The cathode wire 111F and the cathode wire 111B are connected to each other through a through conductor 111V provided through the heat releasing base member 100. Similarly, the anode wires 112F and the anode wires 112B are connected to each other through a through conductor 112V. The cathode wire 111F is an example of a front-surface-side cathode wire, and the cathode wire 111B is an example of a rear-surface-side cathode wire. The anode wires 112FA and 112FB are an example of a pair of front-surface-side anode wires, and the anode wires 112BA and 112BB are an example of a pair of rear-surface-side anode wires.

The light source 20 is mounted on the cathode wire 111F provided on the front surface side of the heat releasing base member 100 with use of an electrically conductive member, and the cathode wire 111F is connected to the cathode electrode 214 (see FIG. 4) of the light source 20. The anode wires 112FA and 112FB provided on the front surface of the heat releasing base member 100 are connected to the anode electrode 218 (see FIG. 4) of the light source 20 by the bonding wires 23A and 23B.

Furthermore, the cathode wire 111B provided on the rear surface side of the heat releasing base member 100 is connected to the cathode wire 11 on the front surface side of the circuit board 10 by an electrically conductive member. Similarly, the anode wires 112BA and 112BB provided on the rear surface side of the heat releasing base member 100 are connected to the anode wires 12A and 12B provided on the front surface side of the circuit board 10 by an electrically conductive member.

FIGS. 10A and 10B are views for explaining wires provided on the front surface side of the heat releasing base member 100 and wires provided on the rear surface side of the heat releasing base member 100 in the light-emitting device 4' according to Modification. FIG. 10A illustrates the wires on the front surface side, and FIG. 10B illustrates the wires on the rear surface side. FIG. 10B is a top view of the wires on the rear surface side seen through the heat releasing base member 100. Accordingly, the rightward direction, the upward direction, and the frontward direction of the paper on which FIGS. 10A and 10B are drawn are an x direction, a y direction, and a z direction, respectively.

As illustrated in FIG. 10A, the cathode wire 111F and the anode wires 112FA and 112FB are provided on the front surface side of the heat releasing base member 100. As illustrated in FIG. 10B, the cathode wire 111B and the anode wires 112BA and 112BB are provided on the rear surface side of the heat releasing base member 100. The cathode wire 111F and the cathode wire 111B are connected to each other through the through conductor 111V. The anode wires 112F (anode wires 112FA and 112FB) and the anode wires 112B (anode wires 112BA and 112BB) are connected to each other through the through conductor 112V. Note that planar shapes (areas) of the cathode wire 111B and the anode wires 112BA and 112BB provided on the rear surface side are larger than planar shapes (areas) of the cathode wire 111F and the anode wires 112FA and 112FB provided on the front surface side. This allows the heat releasing base member 100 to be easily mounted on the circuit board 10.

As illustrated in FIG. 10A, the anode wires 112FA and 112FB are provided symmetrically with respect to a central line C-C of the cathode wire 111F in the x direction. That is, the anode wires 112FA and 112FB are provided so as to sandwich the cathode wire 111F. This relationship on the front surface side also applies to the cathode wire 111B and the anode wires 112BA and 112BB provided on the rear surface side.

Paths of an electric current for light emission in the light-emitting device 4' are similar to those in the light-emitting device 4. In this case, effective inductance of the electric current paths is 0.4 nH, and a rise time of an electric current for light emission is 330 ps.

Light-Emitting Devices 4A and 4B according to Comparative Examples 1 and 2

Next, light-emitting devices 4A and 4B according to comparative examples to which the present exemplary embodiment is not applied are described.

Figure 11A:
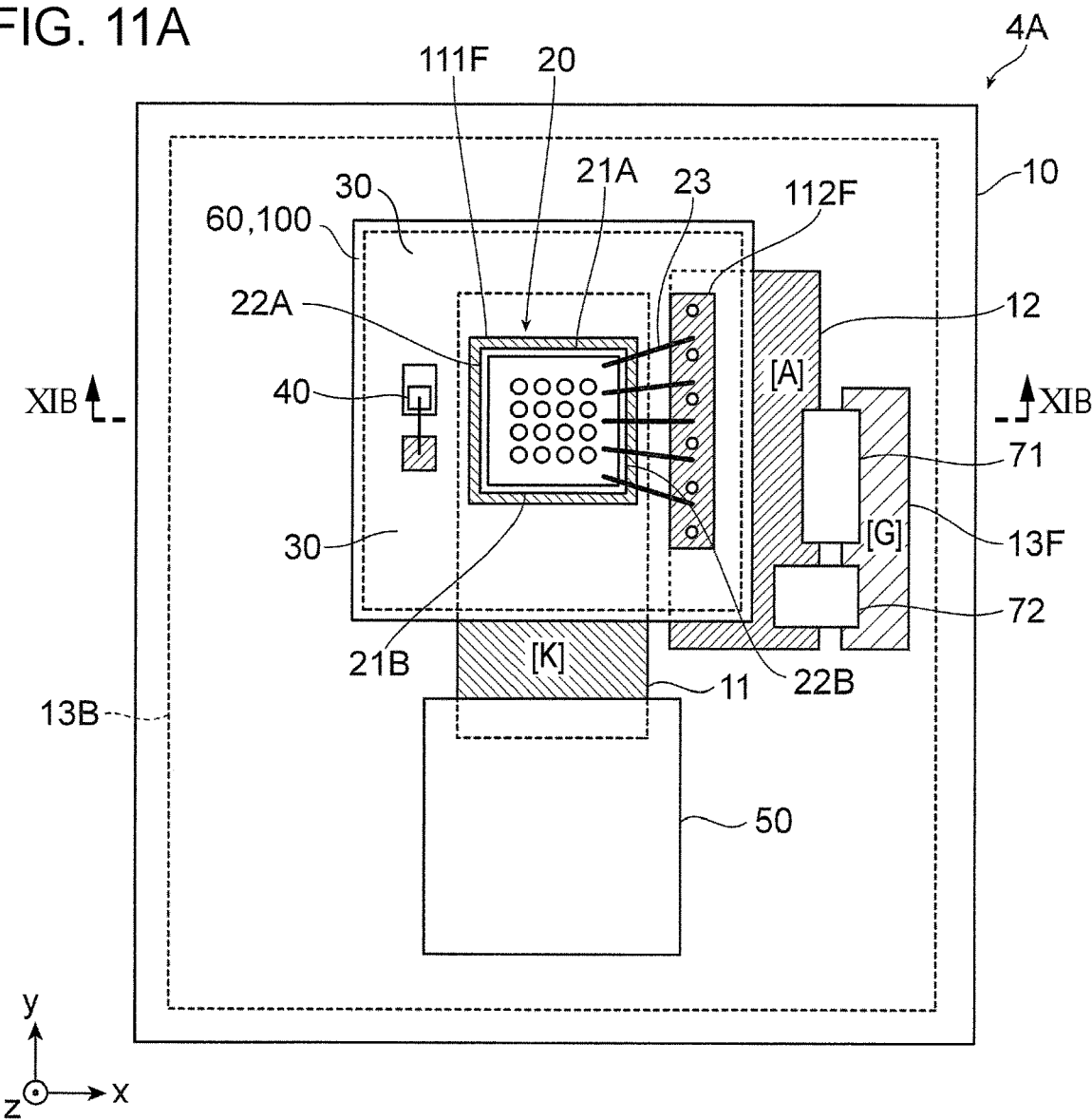
FIGS. 11A and 11B are views for explaining a light-emitting device according to Comparative Example 1 to which the present exemplary embodiment is not applied.
Figure 11B:
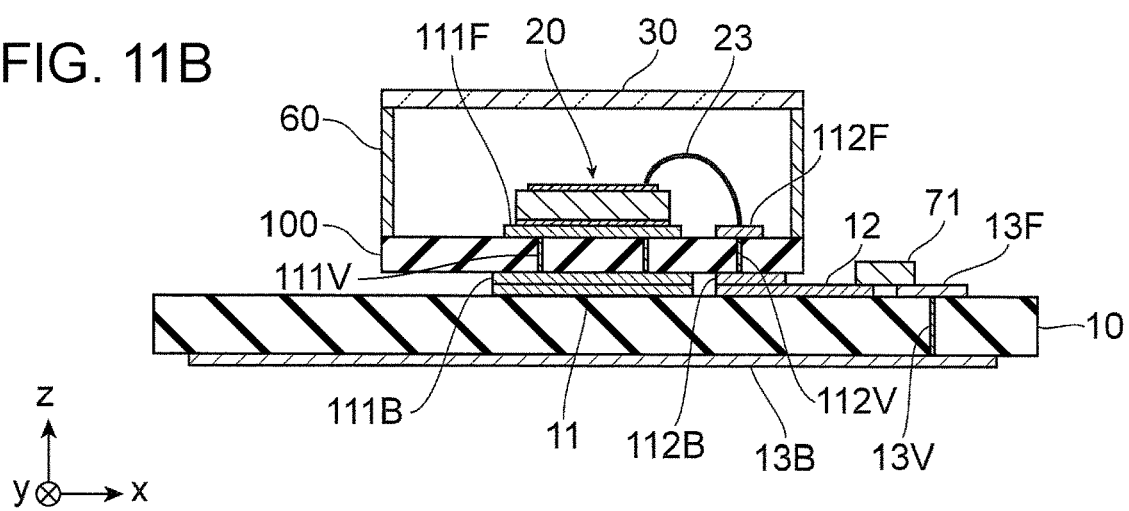

FIGS. 11A and 11B are views for explaining the light-emitting device 4A according to Comparative Example 1 to which the present exemplary embodiment is not applied. FIG. 11A is a plan view, and FIG. 11B is a cross-sectional view taken along line XIB-XIB of FIG. 11A. FIG. 11A is a top view seen through a light diffusion member 30. The light-emitting device 4A includes a heat releasing base member 100 as in the light-emitting device 4'. Except for this, the light-emitting device 4A is similar to the light-emitting device 4', and similar parts are given reference signs, and description thereof is omitted. The following describes differences from the light-emitting device 4'.

The light-emitting device 4A includes capacitors 71 and 72 on only a side surface 22B side of a light source 20. Accordingly, an anode wire 12 and a reference potential wire 13F are provided only on the side surface 22B side of the light source 20 on a circuit board 10. A PD 40 is provided on a side surface 22A side of the light source 20. Description of the PD 40 is omitted.

Similarly, an anode wire 112F is provided only on the side surface 22B side of the light source 20 on a front surface side of the heat releasing base member 100, and an anode wire 112B is provided only on the side surface 22B side of the light source 20 on a rear surface side of the heat releasing base member 100. An anode electrode 218 (see FIG. 4) of the light source 20 and the anode wire 112F are connected to each other by a bonding wire 23 on the front surface side of the heat releasing base member 100.

Figure 12A:
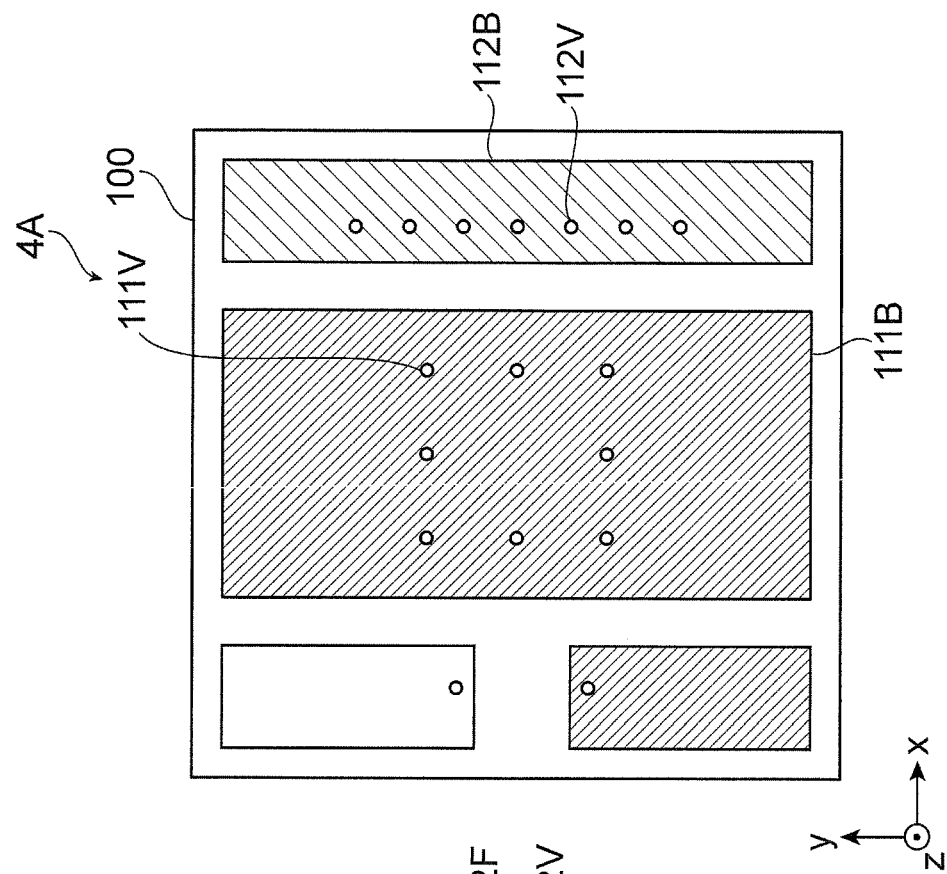
FIGS. 12A and 12B are views for explaining wires provided on a front surface side of a heat releasing base member and wires provided on a rear surface side of the heat releasing base member in the light-emitting device according to Comparative Example 1.
Figure 12B:
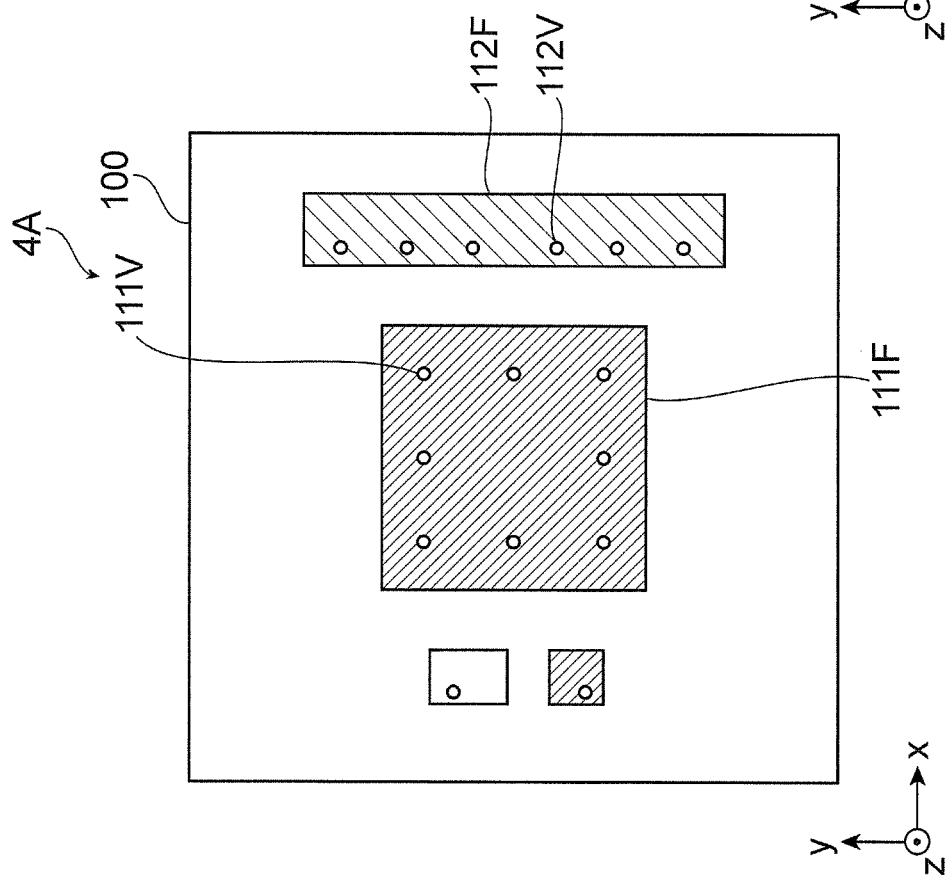

FIGS. 12A and 12B are views for explaining wires provided on the front surface side of the heat releasing base member 100 and wires provided on the rear surface side of the heat releasing base member 100 in the light-emitting device 4A according to Comparative Example 1. FIG. 12A illustrates the wires on the front surface side, and FIG. 12B illustrates the wires on the rear surface side. FIG. 12B is a top view of the wires on the rear surface side seen through the heat releasing base member 100. Accordingly, the rightward direction, the upward direction, and the frontward direction on the paper on which FIGS. 12A and 12B are drawn are an x direction, a y direction, and a z direction, respectively.

As illustrated in FIG. 12A, a cathode wire 111F and the anode wire 112F are provided on the front surface side of the heat releasing base member 100. As illustrated in FIG. 12B, a cathode wire 111B and the anode wire 112B are provided on the rear surface side of the heat releasing base member 100. The cathode wire 111F and the cathode wire 111B are connected to each other through a through conductor 111V. The anode wire 112F and the anode wire 112B are connected to each other through a through conductor 112V. Planar shapes (areas) of the cathode wire 111B and the anode wire 112B provided on the rear surface side are larger than planar shapes (areas) of the cathode wire 111F and the anode wire 112F provided on the front surface side. This allows the heat releasing base member 100 to be easily mounted on the circuit board 10.

Figure 13:
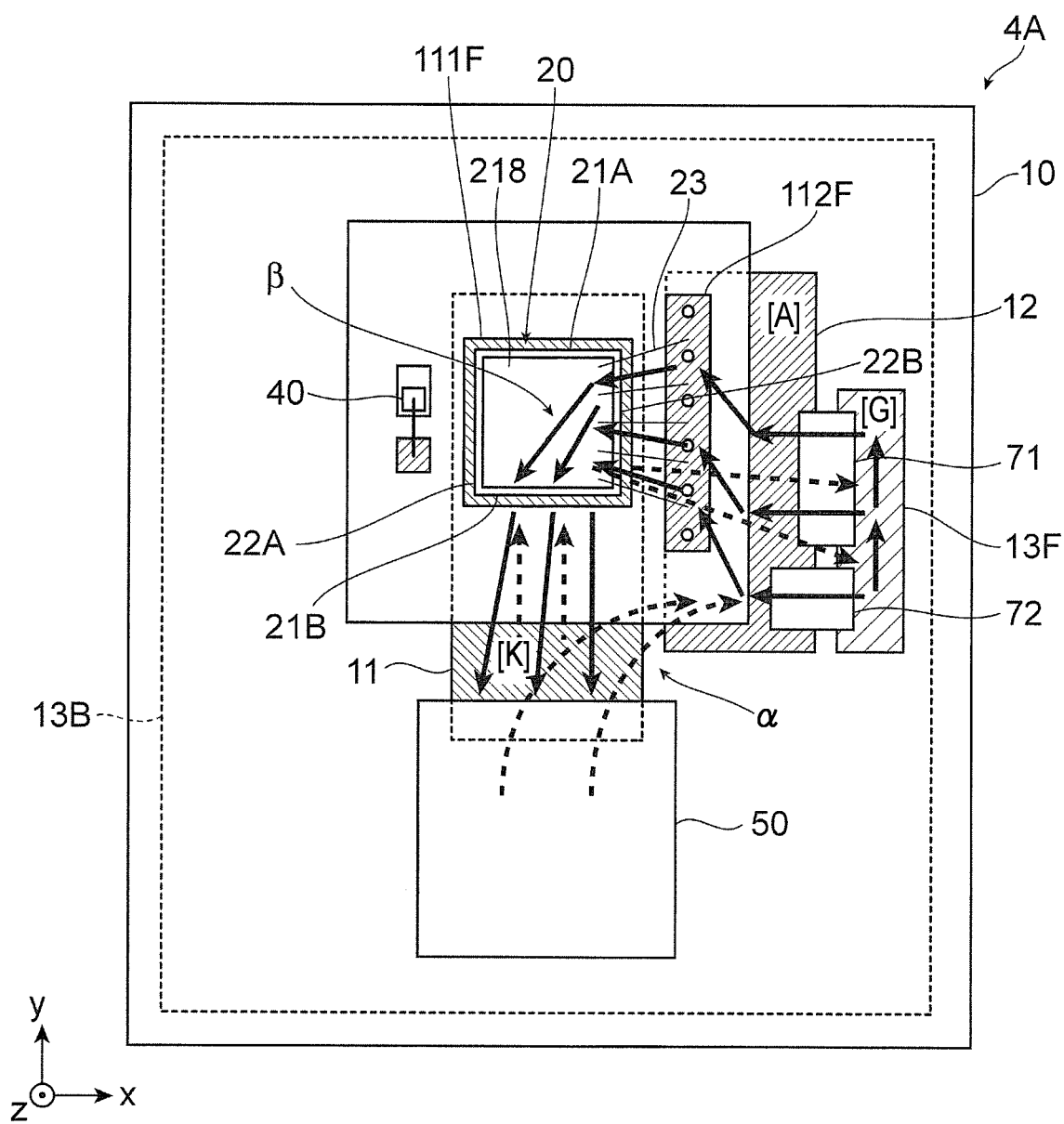
FIG. 13 is a view for schematically explaining electric current paths in the light-emitting device according to Comparative Example 1.

FIG. 13 is a view for schematically explaining electric current paths in the light-emitting device 4A according to Comparative Example 1. The solid arrows indicate a path (electric current path) of an electric current flowing on the front surface side of the circuit board 10, and the broken arrows indicate a path (electric current path) of an electric current flowing through a reference potential wire 13B provided on the rear surface side of the circuit board 10. In FIG. 13, the bonding wires 23 are indicated by the thin lines. Description of the light diffusion member 30 is omitted.

As illustrated in FIG. 13, an electric current flows from the capacitors 71 and 72 to the anode electrode 218 of the light source 20 through the anode wire 12 and the bonding wire 23. Then, the electric current flows from the light source 20 to a driving unit 50 through a cathode wire 11. Then, the electric current returns to the light source 20 side from the driving unit 50 through the reference potential wires 13B on the rear surface side of the circuit board 10 along the cathode wire 11 on the front surface side. Then, the electric current returns to the capacitors 71 and 72 along the anode wire 12 on the front surface side.

In the reference potential wire 13B provided on the rear surface side of the circuit board 10, an electric current (a return electric current indicated by the broken line) that returns from the driving unit 50 to the light source 20 not only flows along a rear surface of the cathode wire 11, but also flows on a side deviated toward the capacitors 71 and 72 (a part indicated by α). Furthermore, the electric current that flows through the anode electrode 218 on the front surface of the light source 20 also flows on a side deviated toward the driving unit 50 (a part indicated by β), and therefore light emission of the light source 20 tends to be uneven on the front surface. This is because the light emission is affected by the layout of the light source 20, the driving unit 50, and the capacitors 71 and 72. Accordingly, the electric current paths of the light-emitting device 4A are longer and effective inductance of the light-emitting device 4A is larger than the light-emitting device 4 to which the present exemplary embodiment is applied. The effective inductance of the electric current paths of the light-emitting device 4A is 0.5 nH, which is larger than the effective inductance (0.4 nH) of the electric current paths of the light-emitting device 4.

Although the light-emitting device 4A includes the heat releasing base member 100, the light-emitting device 4A may be configured not to include the heat releasing base member 100. Even in a case where the light-emitting device 4A does not include the heat releasing base member 100, electric current paths of such a light-emitting device 4A are similar to those described above.

Figure 14A:
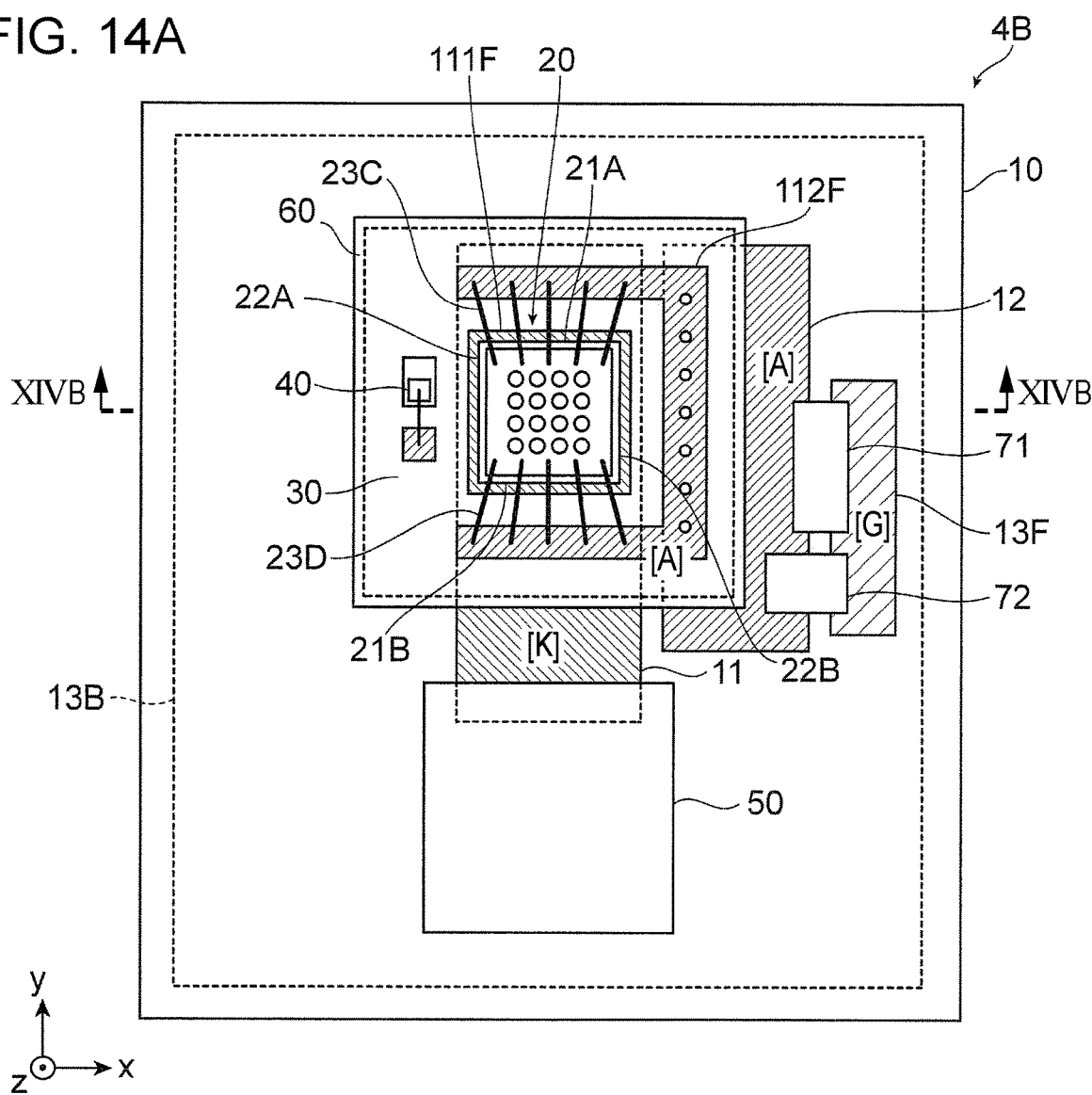
FIGS. 14A and 14B are views for explaining a light-emitting device according to Comparative Example 2 to which the present exemplary embodiment is not applied.
Figure 14B:
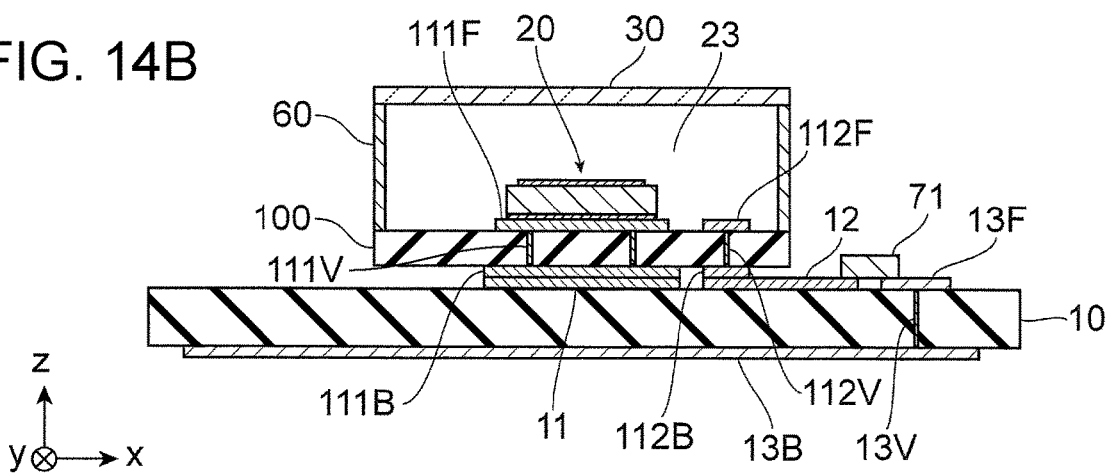

FIGS. 14A and 14B are views for explaining the light-emitting device 4B according to Comparative Example 2 to which the present exemplary embodiment is not applied. FIG. 14A is a plan view, and FIG. 14B is a cross-sectional view taken along line XIVB-XIVB of FIG. 14A. FIG. 14A is a top view seen through a light diffusion member 30. The light-emitting device 4B includes a heat releasing base member 100 as in the light-emitting device 4'. The cross-sectional view illustrated in FIG. 14B is identical to the cross-sectional view of the light-emitting device 4B of FIG. 11B. Except for this, the light-emitting device 4B is similar to the light-emitting device 4', and similar parts are given reference signs, and description thereof is omitted. The following describes differences from the light-emitting device 4'.

The light-emitting device 4B includes capacitors 71 and 72 on only a side surface 22B side of a light source 20, as in the light-emitting device 4A. Accordingly, an anode wire 12 and a reference potential wire 13F are provided only on the side surface 22B side of the light source 20 on a circuit board 10. A PD 40 is provided on a side surface 22A side of the light source 20. Description of the PD 40 is omitted.

An anode wire 112F is provided so as to surround side surface 21A, 22B, 21B sides of the light source 20 on a front surface side of the heat releasing base member 100, and an anode wire 112B is provided so as to surround side surface 21A, 22B, 21B sides of the light source 20 on a rear surface side of the heat releasing base member 100 (see FIG. 15, which will be described later). On the front surface side of the heat releasing base member 100, an anode electrode 218

(see FIG. 4) of the light source 20 and the anode wire 112F are connected by bonding wires 23C and 23D on two sides (side surface 21A and 21B sides) of the light source 20.

The light-emitting device 4B, in which the anode wire 112F is provided so as to surround the side surface 21A, 22B, and 21B sides of the light source 20 in the light-emitting device 4A, is configured to easily supply an electric current to the light source 20.

Figure 15A:
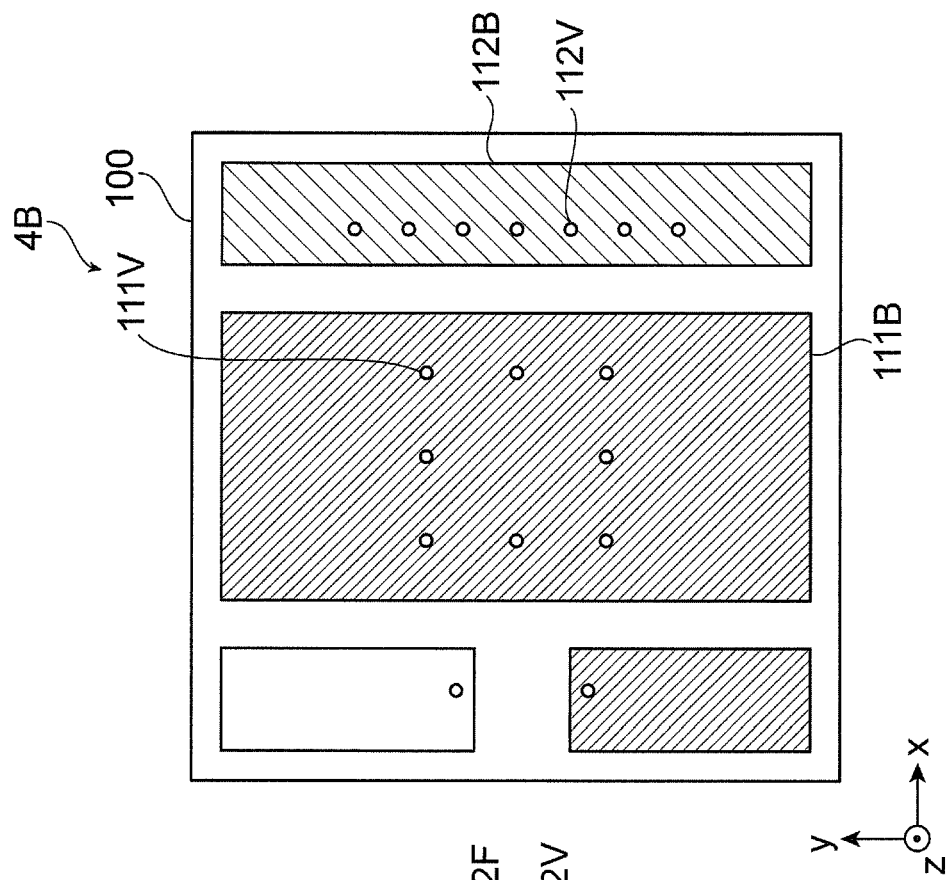
FIGS. 15A and 15B are views for explaining wires provided on a front surface side of a heat releasing base member and wires provided on a rear surface side of the heat releasing base member in the light-emitting device according to Comparative Example 2.
Figure 15B:
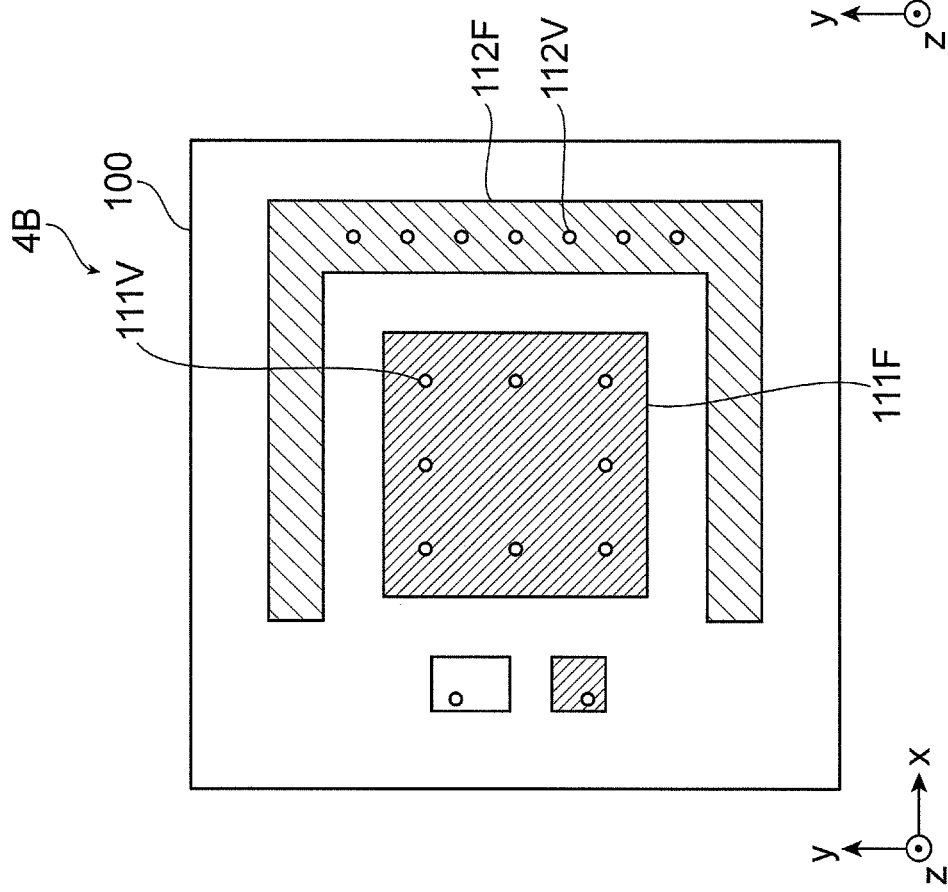

FIGS. 15A and 15B are views for explaining wires provided on the front surface side of the heat releasing base member 100 and wires provided on the rear surface side of the heat releasing base member 100 in the light-emitting device 4B according to Comparative Example 2. FIG. 15A illustrates the wires on the front surface side, and FIG. 12B illustrates wires on the rear surface side. FIG. 15B is a top view of the wires on the rear surface side seen through the heat releasing base member 100. Accordingly, the rightward direction, the upward direction, and the frontward direction of the paper on which FIGS. 15A and 15B are drawn are an x direction, a y direction, and a z direction, respectively. The wires on the rear surface side in FIG. 15B are identical to the wires provided on the rear surface side of the heat releasing base member 100 in the light-emitting device 4A illustrated in FIG. 12B.

As illustrated in FIG. 15A, a cathode wire 111F and the anode wire 112F are provided on the front surface side of the heat releasing base member 100. As illustrated in FIG. 15B, a cathode wire 111B and the anode wire 112B are provided on the rear surface side of the heat releasing base member 100. The cathode wire 111F and the cathode wire 111B are connected to each other through a through conductor 111V. The anode wire 112F and the anode wire 112B are connected to each other through a through conductor 112V. Planar shapes (areas) of the cathode wire 111B and the anode wire 112B provided on the rear surface side are larger than planar shapes (areas) of the cathode wire 111F and the anode wire 112F provided on the front surface side. This allows the heat releasing base member 100 to be easily mounted on the circuit board 10.

Figure 16:
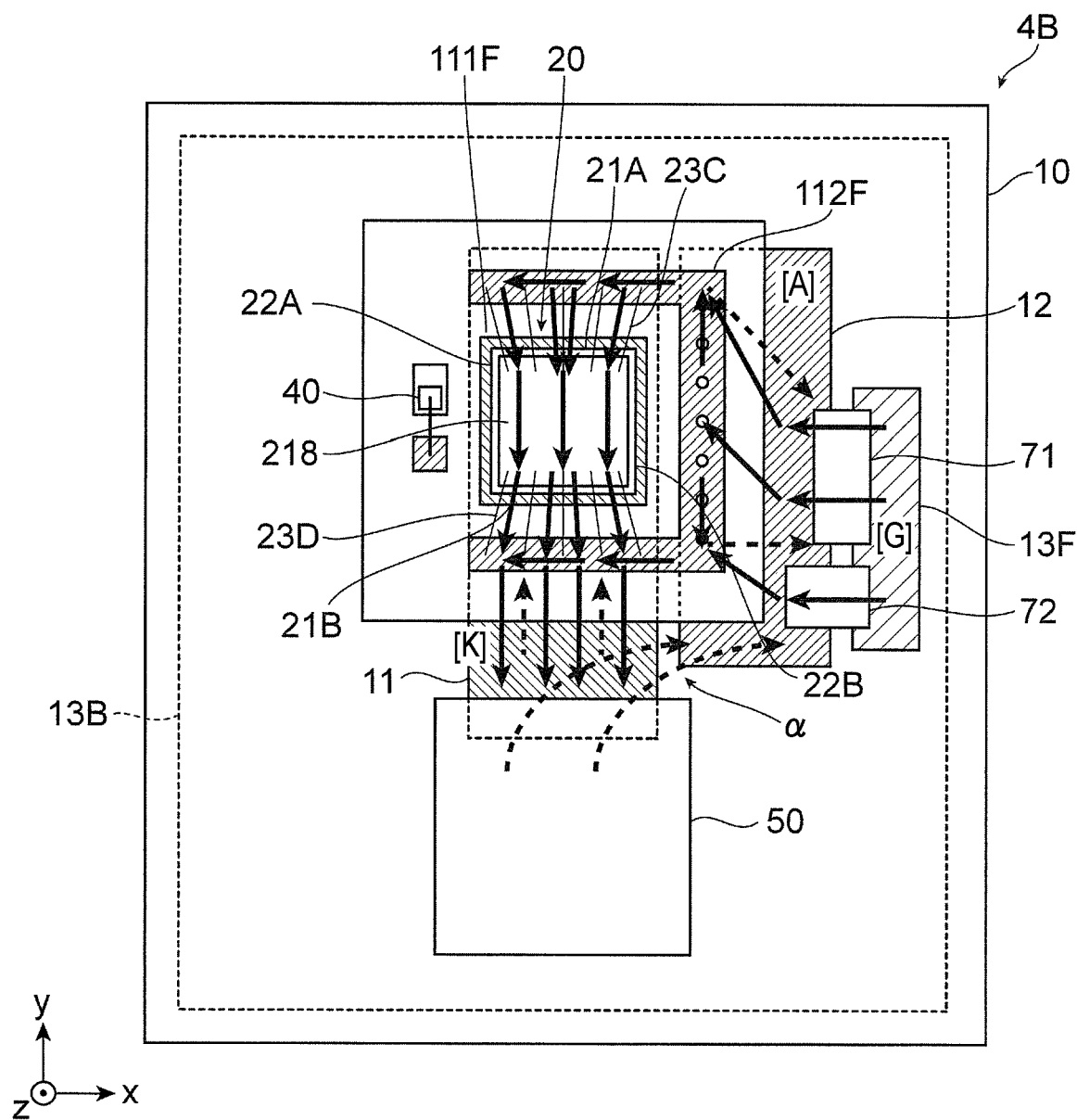
FIG. 16 is a view for schematically explaining electric current paths in the light-emitting device according to Comparative Example 2.

FIG. 16 is a view for schematically explaining electric current paths in the light-emitting device 4B according to Comparative Example 2. The solid arrows indicate a path (electric current path) of an electric current flowing on the front surface side of the circuit board 10, and the broken arrows indicate a path (electric current path) of an electric current flowing through the reference potential wire 13B provided on the rear surface side of the circuit board 10. In FIG. 16, the bonding wires 23C and 23D are indicated by the thin lines. Description of the light diffusion member 30 is omitted.

As illustrated in FIG. 16, an electric current flows from the capacitors 71 and 72 to the anode electrode 218 of the light source 20 through the anode wire 12 and the bonding wires 23C and 23D. The electric current flows from the light source 20 to a driving unit 50 through a cathode wire 11. Then, the electric current returns to the light source 20 side from the driving unit 50 through a reference potential wire 13B on the rear surface side of the circuit board 10 along the cathode wire 11 on the front surface side. Then, the electric current returns to the capacitors 71 and 72 along the anode wire 12 on the front surface side.

In the reference potential wire 13B provided on the rear surface side of the circuit board 10, the electric current (return electric current indicated by the broken line) that returns from the driving unit 50 to the light source 20 side not only flows along a rear surface of the cathode wire 11, but also flows on a side deviated toward the capacitors 71 and 72 (a part indicated by a). Since the anode wire 112F is provided so as to surround three side surfaces (the side surfaces 21A, 22B, and 21B) of the light source 20, an electric current flows through the anode electrode 218 on the front surface of the light source 20 from the side surface 21A side to the side surface 21B. Accordingly, light emission of the light source 20 is unlikely to be uneven on the front surface. However, since the electric current is supplied to the side surface 21A side of the light source 20 by the anode wire 112F, the electric current path in the light-emitting device 4B becomes longer than the electric current path in the light-emitting device 4A. This increases effective inductance. The effective inductance of the electric current paths in the light-emitting device 4B is 0.6 nH, which is larger than the effective inductance (0.4 nH) of the electric current paths of the light-emitting device 4' and the effective inductance of the electric current paths of the light-emitting device 4A. A rise time of light emission in the light-emitting device 4B is 660 ps, which is longer than a rise time (330 ps) of the light-emitting device 4'.

Note that the light-emitting device 4B, in which the anode wire 112F on the heat releasing base member 100 and the cathode wire 11 on the circuit board 10 intersect each other, requires use of the heat releasing base member 100.

As described above, in the light-emitting devices 4 and 4' to which the present exemplary embodiment is applied, the capacitors 71 and 72 are provided beside two sides (the side surfaces 22A and 22B in FIGS. 7 and 9) of the light source 20 that face each other, and the driving unit 50 is provided beside another side (the side surface 21B in FIGS. 7 and 9) of the light source 20, and therefore an electric current (return electric current) that returns through the reference potential wire 13B provided on the rear surface side of the circuit board 10 flows at minimum impedance. This reduces effective inductance of the electric current paths, thereby shortening a rise time of light emission. Specifically, in the light-emitting device 4 (light-emitting device 4') to which the present exemplary embodiment is applied, the effective inductance is reduced from 0.6 nH to 0.4 nH, and a rise time of an electric current for light emission is improved from 660 ps to 330 ps, as compared with the general light-emitting device 4B using the heat releasing base member 100 according to Comparative Example 2.

In the light-emitting devices 4 and 4' to which the present exemplary embodiment is applied, the light diffusion member 30 for outputting incident light after changing a spread angle of the incident light to a larger angle by diffusion is used. A diffractive member such as a diffractive optical element (DOE) for outputting incident light after changing a direction of the incident light to a different direction may be used instead of the light diffusion member 30.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A light-emitting device comprising:
   a laser element array having a quadrangular planar shape, the laser element array including an anode electrode;
   a first pair of capacitors that supply an electric current for light emission of the laser element array, each capacitor of the first pair of capacitors being electrically connected to anode wires, respectively;
   a driving unit that drives the laser element array by turning on and off the electric current for light emission of the laser element array; and
   a pair of bonding wires, each bonding wire directly connecting the anode electrode of the laser element array to a respective one of the anode wires, wherein
   the first pair of capacitors are disposed beside two sides of the laser element array that face each other so as to sandwich the laser element array,
   the driving unit is disposed beside another side of the laser element array, and
   the anode electrode is different from the anode wires.

2. The light-emitting device according to claim 1, wherein
   the driving unit includes a driving element that turns on and off the electric current for light emission of the laser element array; and
   the laser element array and the driving element are connected to each other so that the laser element array is driven by low-side driving in which the driving element is provided on a downstream side of an electric current path relative to the laser element array.

3. The light-emitting device according to claim 1, further comprising a circuit board on which the laser element array and the driving unit are mounted, wherein
   the laser element array and the driving unit are provided on a front surface of the circuit board, and
   the circuit board has a reference potential wire as a layer.

4. The light-emitting device according to claim 2, further comprising a circuit board on which the laser element array and the driving unit are mounted, wherein
   the laser element array and the driving unit are provided on a front surface of the circuit board, and
   the circuit board has a reference potential wire as a layer.

5. The light-emitting device according to claim 3, further comprising a heat releasing base member having higher thermal conductivity than the circuit board, wherein
   the laser element array is provided on the heat releasing base member, and the heat releasing base member is mounted on the circuit board.

6. The light-emitting device according to claim 5, wherein
   the laser element array includes a plurality of surface emitting laser elements that are connected in parallel and has a cathode electrode on a rear surface side thereof and the anode electrode on a front surface side thereof.

7. The light-emitting device according to claim 6, wherein
   the heat releasing base member has, on a front surface side thereof, a front-surface-side cathode wire connected to the cathode electrode of the laser element array and a pair of front-surface-side anode wires of the anode wires connected to the anode electrode of the laser element array so as to sandwich the front-surface-side cathode wire and has, on a rear surface side thereof, a rear-surface-side cathode wire and a pair of rear-surface-side anode wires of the anode wires that are provided at positions corresponding to the front-surface side cathode wire and the pair of front-surface-side anode wires and are electrically connected to the front-surface side cathode wire and the pair of front-surface-side anode wires, respectively.

8. The light-emitting device according to claim 1, further comprising a diffusion member that diffuses light emitted from the laser element array and outputs the diffused light.

9. The light-emitting device according to claim 2, further comprising a diffusion member that diffuses light emitted from the laser element array and outputs the diffused light.

10. The light-emitting device according to claim 1, further comprising a diffraction member that diffracts light emitted from the laser element array and outputs the diffracted light.

11. The light-emitting device according to claim 1, further comprising a light amount monitoring light receiving element that monitors a light amount of the laser element array.

12. An optical device comprising:
    the light-emitting device according to claim 1; and
    a light receiving unit that receives light emitted from the laser element array of the light-emitting device and then reflected by an object to be measured.

13. A measurement device comprising:
    the optical device according to claim 12; and
    a distance specifying unit that specifies a distance to an object to be measured on a basis of a period from emission of light from the laser element array of the optical device to reception of the light by the light receiving unit.

14. An information processing apparatus comprising:
    the measurement device according to claim 13; and
    an authentication processing unit that performs authentication processing concerning use of the information processing apparatus on a basis of the distance specified by the distance specifying unit of the measurement device.

15. The light-emitting device according to claim 1, further comprising a second pair of capacitors,
    wherein a first capacitor of the first pair of capacitors and a second capacitor of the second pair of capacitors are disposed beside a same side of the laser element array and have different lengths.

16. The light-emitting device according to claim 15, wherein the first capacitor has a smaller capacity than the second capacitor.

17. The light-emitting device according to claim 16, wherein the first capacitor has a larger planar shape than the second capacitor.

18. The light-emitting device according to claim 16, wherein the first capacitor supplies to the light source when increasing the light emission.

* * * * *